US009331072B2

(12) United States Patent
Seo et al.

(10) Patent No.: US 9,331,072 B2
(45) Date of Patent: May 3, 2016

(54) INTEGRATED CIRCUIT DEVICES HAVING AIR-GAP SPACERS DEFINED BY CONDUCTIVE PATTERNS AND METHODS OF MANUFACTURING THE SAME

(71) Applicants: Kang-Ill Seo, Eumseong-gun (KR); Jin-Wook Lee, Seoul (KR)

(72) Inventors: Kang-Ill Seo, Eumseong-gun (KR); Jin-Wook Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 171 days.

(21) Appl. No.: 14/165,721

(22) Filed: Jan. 28, 2014

(65) Prior Publication Data

US 2015/0214220 A1 Jul. 30, 2015

(51) Int. Cl.
*H01L 27/088* (2006.01)
*H01L 23/485* (2006.01)
*H01L 21/8234* (2006.01)

(52) U.S. Cl.
CPC ...... *H01L 27/088* (2013.01); *H01L 21/823468* (2013.01); *H01L 23/485* (2013.01); *H01L 2924/0002* (2013.01)

(58) Field of Classification Search
CPC . H01L 27/088; H01L 23/528; H01L 23/5329; H01L 21/823468; H01L 23/485; H01L 2924/0002
USPC .......................................................... 257/392
See application file for complete search history.

(56) References Cited

U.S. PATENT DOCUMENTS

| | | | |
|---|---|---|---|
| 5,770,507 A | 6/1998 | Chen et al. | |
| 5,914,519 A | 6/1999 | Chou et al. | |
| 6,051,861 A | 4/2000 | Togo | |
| 6,093,612 A | 7/2000 | Suh | |
| 6,127,711 A | 10/2000 | Ono | |
| 6,180,988 B1 | 1/2001 | Wu | |
| 7,026,689 B2 | 4/2006 | Liaw | |
| 7,091,567 B2 | 8/2006 | Park et al. | |
| 7,838,373 B2 | 11/2010 | Giles et al. | |
| 7,994,040 B2 | 8/2011 | Chi et al. | |
| 8,294,194 B2 | 10/2012 | Noda et al. | |
| 2003/0211684 A1* | 11/2003 | Guo ................. | H01L 21/28114 438/230 |
| 2006/0131655 A1 | 6/2006 | Kunnen | |
| 2010/0123202 A1* | 5/2010 | Hofmann ............ | H01L 21/8221 257/401 |

(Continued)

FOREIGN PATENT DOCUMENTS

| | | |
|---|---|---|
| JP | 2001-111051 | 4/2001 |
| JP | 2008-198762 | 8/2008 |

(Continued)

*Primary Examiner* — Peter Bradford
(74) *Attorney, Agent, or Firm* — Myers Bigel & Sibley, P.A.

(57) ABSTRACT

Integrated circuit devices having a cavity and methods of manufacturing the integrated circuit devices are provided. The integrated circuit devices may include a pair of spacers, which define a recess. The integrated circuit device may also include a lower conductive pattern in the recess and an upper conductive pattern on the lower conductive pattern. The upper conductive pattern may have an etch selectivity with respect to the lower conductive pattern and may expose an upper surface of the lower conductive pattern adjacent a sidewall of the upper conductive pattern. An inner sidewall of one of the pair of spacers, the upper surface of the lower conductive pattern and the sidewall of the upper conductive pattern may define a space and a capping pattern may be formed on the upper conductive pattern to seal a top portion of the space, such that a cavity is disposed under the capping pattern.

30 Claims, 21 Drawing Sheets

(56) References Cited

U.S. PATENT DOCUMENTS

| | | |
|---|---|---|
| 2011/0217838 A1 | 9/2011 | Hsiech et al. |
| 2012/0104512 A1* | 5/2012 | Horak et al. .................. 257/401 |
| 2013/0248950 A1* | 9/2013 | Kang et al. ................... 257/288 |
| 2014/0070320 A1* | 3/2014 | Mukherjee et al. ........... 257/368 |
| 2014/0299989 A1* | 10/2014 | Lim et al. ...................... 257/751 |
| 2015/0014759 A1* | 1/2015 | Lee et al. ...................... 257/306 |

FOREIGN PATENT DOCUMENTS

| | | |
|---|---|---|
| JP | 2010-157588 | 7/2010 |
| KR | 1019990018366 | 3/1999 |
| KR | 1020000007795 | 2/2000 |
| KR | 1020010011638 | 2/2001 |
| KR | 1020050121521 | 12/2005 |

* cited by examiner

10

1200

INTEGRATED CIRCUIT DEVICES HAVING AIR-GAP SPACERS DEFINED BY CONDUCTIVE PATTERNS AND METHODS OF MANUFACTURING THE SAME

FIELD

The present disclosure generally relates to the field of electronics and, more particularly, to integrated circuit devices.

BACKGROUND

Distances between conductive patterns, including gate structures and contact patterns, have been reduced to increase density of integrated circuit devices. Accordingly, parasitic capacitance between conductive patterns has been increased.

SUMMARY

An integrated circuit device may include a pair of spacers spaced apart from each other on a substrate and the pair of spacers may define a recess. The integrated circuit device may also include a lower conductive pattern in the recess on the substrate and an upper conductive pattern in the recess on the lower conductive pattern. The upper conductive pattern may expose a portion of an upper surface of the lower conductive pattern adjacent a sidewall of the upper conductive pattern, an inner sidewall of one of the pair of spacers, the portion of the upper surface of the lower conductive pattern and the sidewall of the upper conductive pattern define a space. The upper conductive pattern may have an etch selectivity with respect to the lower conductive pattern. The integrated circuit device may further include a capping pattern on the upper conductive pattern and the capping pattern may seal a top portion of the space such that a cavity may be disposed under the capping pattern.

According to various embodiments, an uppermost surface of the upper conductive pattern may be lower than uppermost surfaces of the pair of spacers relative to an upper surface of the substrate. The capping pattern may be in the recess.

In various embodiments, the cavity may include an air-gap.

In various embodiments, the integrated circuit device may further include an insulating pattern in the cavity and the insulating pattern may include SiCN, SiBCN or SiOCN.

According to various embodiments, the lower and upper conductive patterns may be included in a gate electrode and the integrated circuit device may further include a gate insulator between the substrate and the gate electrode. The gate insulator may extend between the inner sidewall of the one of the pair of spacers and a sidewall of the gate electrode.

In various embodiments, an uppermost surface of the lower conductive pattern and an uppermost surface of the gate insulator may be at an equal level.

In various embodiments, the integrated circuit device may further include a work function control pattern between the substrate and the lower conductive pattern. An upper surface of the work function control pattern may include a recess.

In various embodiments, the lower conductive pattern may cover an entire upper surface of the work function control pattern.

In various embodiments, the work function control pattern may conformally extend on a portion of a sidewall and a bottom surface of the upper conductive pattern. The lower conductive pattern may conformally extend between the upper conductive pattern and the work function control pattern.

According to various embodiments, the lower conductive pattern may partially surround the sidewall of the upper conductive pattern.

According to various embodiments, the integrated circuit device may further include a conductive region on the substrate adjacent the one of the pair of spacers and out of the recess, an insulating layer on the capping pattern, the pair of spacers and the conductive region, and a conductive pattern passing through the insulating layer. The conductive pattern may contact the one of the pair of spacers and the conductive region.

In various embodiments, the insulating layer may have an etch selectivity with respect to the pair of spacers.

In various embodiments, the conductive pattern may contact an upper surface of the capping pattern, and the insulating layer may have an etch selectivity with respect to the capping pattern.

According to various embodiments, the pair of spacers may include a first pair of spacers, the recess may include a first recess, the lower and upper conductive patterns may include a first gate electrode, and the capping pattern may include a first capping pattern. The first pair of spacers, the first gate electrode, and the first capping pattern may be included in a first gate structure in a first region of the substrate. The integrated circuit device may further include a second gate structure in a second region of the substrate and the second gate structure may be free of a cavity. The second gate structure may include a second pair of spacers spaced apart from each other on the substrate, and the second pair of spacers may define a second recess. The second gate structure may also include a second gate electrode in the second recess on the substrate. The second gate electrode may include a material included in the lower conductive pattern of the first gate electrode. The second gate structure may further include a second capping pattern on the second gate electrode.

In various embodiments, an upper surface of the second gate electrode may be planar, and the second capping pattern contacts the upper surface of the second gate electrode.

In various embodiments, the material included in the lower conductive pattern may include a first material and the upper conductive pattern of the first gate electrode may include a second material. The second material may be absent from the second gate electrode pattern.

An integrated circuit device may include a pair of spacers spaced apart from each other on a substrate and the pair of spacers may define a recess. The integrated circuit device may also include a conductive pattern in the recess on the substrate. The conductive pattern may include an upper portion and a lower portion, and a width of the upper portion may be smaller than a width of the lower portion such that a space may be defined by a sidewall of the upper portion of the conductive pattern and an inner sidewall of one of the pair of spacers. The integrated circuit device may further include a capping pattern in the recess on the conductive pattern and the capping pattern may seal a top portion of the space such that a cavity may be disposed under the capping pattern.

According to various embodiments, the upper portion of the conductive pattern may have an etching selectivity with respect to the lower portion of the conductive pattern.

According to various embodiments, an uppermost surface of the conductive pattern may be lower than uppermost surfaces of the pair of spacers relative to an upper surface of the substrate.

An integrated circuit device may include a conductive pattern on a substrate. The conductive pattern may include an upper conductive pattern and a lower conductive pattern, and the lower conductive pattern may have an etch selectivity with respect to the upper conductive pattern and may extend between the upper conductive pattern and the substrate. The integrated circuit device may also include a spacer on the substrate adjacent a sidewall of the conductive pattern, a cavity between a sidewall of the upper conductive pattern and an inner sidewall of the spacer, and a capping pattern on the conductive pattern.

In various embodiments, the capping pattern may contact the inner sidewall of the spacer.

In various embodiments, an uppermost surface of the upper conductive pattern may be higher than an uppermost surface of the lower conductive pattern relative to an upper surface of the substrate. The upper conductive pattern may expose a portion of the uppermost surface of the lower conductive pattern adjacent the inner sidewall of the spacer.

An integrated circuit device may include a pair of spacers spaced apart from each other on a substrate and the pair of spacers may define a recess. The integrated circuit device may also include a conductive pattern in the recess on the substrate and an uppermost surface of the conductive pattern may be lower than uppermost surfaces of the pair of spacers relative to an upper surface of the substrate. The integrated circuit device may further include a cavity between the conductive pattern and an inner sidewall of one of the pair of spacers. The cavity may only cover an upper portion of conductive pattern. Additionally, the integrated circuit device may include a capping pattern in the recess on the conductive pattern, an insulating layer on the capping pattern and the pair of spacers, and a conductive pattern passing through the insulating layer. The insulating layer may have an etch selectivity with respect to the pair of spacers and the conductive pattern may contact an outer sidewall of the one of the pair of spacers.

According to various embodiments, a horizontal distance between the inner sidewall of the one of the pair of spacers and the upper portion of the conductive pattern may be greater than a horizontal distance between the inner sidewall of the one of the pair of spacers and a lower portion of the conductive pattern.

In various embodiments, the upper portion of the conductive pattern may have an etch selectivity with respect to the lower portion of the conductive pattern.

According to various embodiments, the integrated circuit device may further include a conductive region on the substrate adjacent the one of the pair of spacers and out of the recess. The conductive pattern may contact the conductive region.

A field effect transistor may include a substrate including a fin extending in a first direction, a gate electrode crossing over the fin and extending in a second direction different from the first direction. The field effect transistor may also include a capping pattern on the gate electrode and the capping pattern may extend in the second direction. The field effect transistor may further include a cavity between the gate electrode and capping pattern and the cavity may extend in the second direction.

According to various embodiments, an upper surface of the gate electrode may be planar and the cavity may have a uniform height in the second direction.

In various embodiments, the upper surface of the gate electrode may be higher than an uppermost surface of the fin such that the gate electrode may bury the fin.

According to various embodiments, the gate electrode may include a lower gate electrode. The field effect transistor may further include a spacer and an upper gate electrode adjacent respective sides of the cavity. The spacer and the upper gate electrode may extend in the second direction.

In various embodiments, the upper gate electrode may have an etch selectivity with respect to the lower gate electrode.

In various embodiments, the field effect transistor may further include a gate insulating layer between an inner sidewall of the spacer and a sidewall of lower gate electrode.

According to various embodiments, the cavity may include an air-gap.

According to various embodiments, the field effect transistor may further include an insulating pattern in the cavity and the insulating pattern may include SiCN, SiBCN or SiOCN.

DETAILED DESCRIPTION

Figure 1:
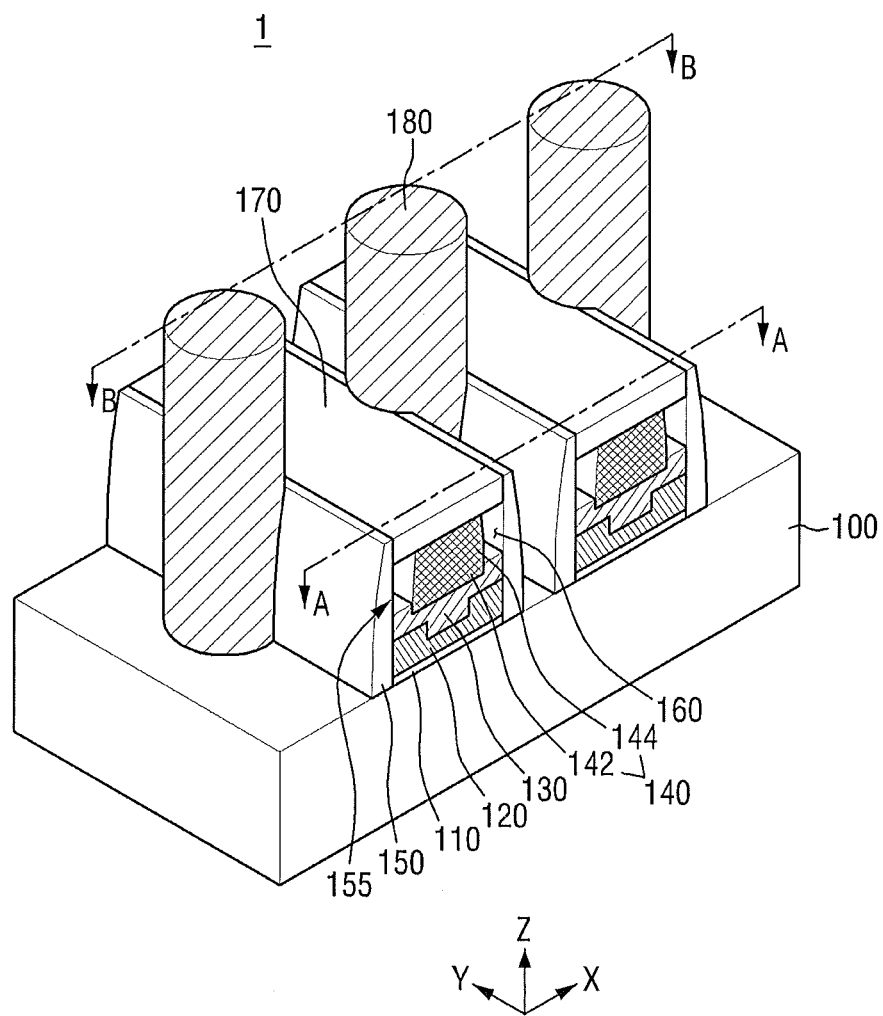
FIG. 1 is a perspective view illustrating a semiconductor device according to some embodiments of the present inventive concept.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout.

Example embodiments of the inventive concepts are described herein with reference to cross-sectional and perspective view that are schematic illustrations of idealized embodiments and intermediate structures of example embodiments. As such, variations from the shapes of the illustrations as a result, for example, of manufacturing techniques and/or tolerances, are to be expected. Thus, example embodiments of the inventive concepts should not be construed as limited to the particular shapes illustrated herein but include deviations in shapes that result, for example, from manufacturing.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

It will be understood that although the terms first, second, etc. may be used herein to describe various elements, these elements should not be limited by these terms. These terms are only used to distinguish one element from another. Thus, a first element could be termed a second element without departing from the teachings of the present embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein may be interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Figure 2:
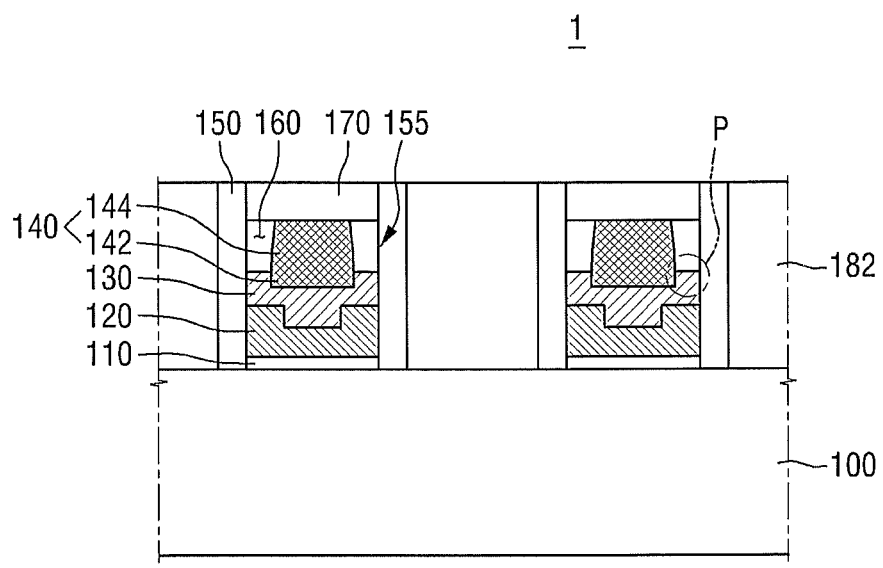
FIGS. 2 and 3 are cross-sectional views of the semiconductor device in FIG. 1 taken along line A-A and line B-B, respectively.
Figure 3:
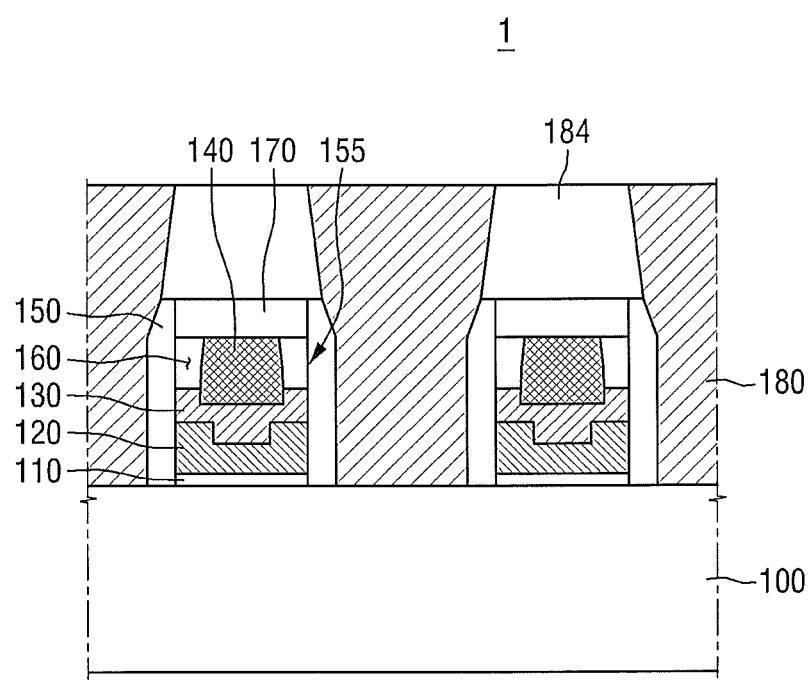

FIG. 1 is a perspective view illustrating a semiconductor device according to some embodiments of the present inventive concept. FIGS. 2 and 3 are cross-sectional views of the semiconductor device in FIG. 1 taken along line A-A and line B-B, respectively.

Referring to FIGS. 1 through 3, a semiconductor device 1 according to some embodiments of the present inventive concept includes a first gate structure on a substrate 100. The first gate structure may include a first gate insulation film 110, a first work function control film 120, a first lower gate electrode 130, a first upper gate electrode 140 and a first capping pattern 170, which are sequentially stacked on the substrate 100 in a first trench 155 that is defined by a first gate spacer 150. The first gate structure includes a first air-gap spacer 160. The first gate structure may extend in a direction Y.

The semiconductor device 1 may include a first interlayer dielectric film 182 on a sidewall of the first gate structure and a second interlayer dielectric film 184 on the first gate structure and on the first interlayer dielectric film 182. The semiconductor device 1 may also include a first contact 180 adjacent the first gate structure. The first contact 180 may be formed through the first and second interlayer dielectric films 182 and 184.

The substrate 100 may be a bulk silicon substrate or a silicon-on-insulator (SOI) substrate. The substrate 100 may be a silicon substrate, or a substrate including, for example, germanium, silicon germanium, indium antimonide, lead telluride compound, indium arsenide, indium phosphide, gallium arsenide and/or gallium antimonide.

The first gate spacer 150 may include, for example, silicon nitride, silicon oxynitride and/or silicon oxide. In some embodiments, the first contact 180 may be formed by a self aligned contact (SAC) process and the first gate spacer 150 may include a material having an etching selectivity with respect to the first and second interlayer dielectric films 182 and 184.

The first trench 155 is defined by a pair of first gate spacers 150 spaced apart from each other. Specifically, the pair of first gate spacers 150 may define sides of the first trench 155 and the substrate 100 may define a bottom surface of the first trench 155.

The first interlayer dielectric film 182 may be formed on an outer sidewall of the first gate spacer 150. The first interlayer dielectric film 182 may include, for example, a low-k material, oxide, nitride, and/or oxynitride. The low-k material may include, for example, flowable oxide (FOX), tonen silazene (TOXZ), undoped silicate glass (USG), borosilicate glass (BSG), phosphosilicate glass (PSG), borophosphosilicate glass (BPSG), plasma-enhanced tetraethylorthosilicate (PE-TEOS), fluorosilicate glass (FSG), high density plasma (HDP) oxide, plasma enhanced oxide (PEOX) and/or flowable CVD (FCVD). In some embodiments, the first interlayer dielectric film 182 may include a material having an etching selectivity with respect to the first gate spacer 150.

The first gate insulation film 110 may be formed on the bottom surface of the first trench 155 while exposing portions of the sides of the first trench 155. The first gate insulation film 110 may include a high-k material. Examples of the high-k material include hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide and lead zinc niobate.

The first work function control film 120 may be formed in the first trench 155 on the first gate insulation film 110. The first work function control film 120 may be formed on the bottom surface of the first trench 155 and on a portion of the sidewall of the first trench 155. An upper surface of the first work function control film 120 may include a recess. In some embodiments, the first gate structure of the semiconductor device 1 may include a PMOS transistor and the first work function control film 120 may be a p-type work function control film. The p-type work function control film may include, for example, TiN, WN, TaN and/or Ru. In some embodiments, the first gate structure of the semiconductor device 1 may include an NMOS transistor and the first work function control film 120 may be an n-type work function control film. The n-type work function control film may include, for example, Ti, Ag, Al, TiAl, TiAlN, TiAlC, TaC, TaCN, TaSiN, Mn and/or Zr.

The first lower gate electrode 130 may be formed in the first trench 155 on the first work function control film 120, such that the first work function control film 120 may be disposed between the first lower gate electrode 130 and the substrate 100. The first lower gate electrode 130 may cover an entire upper surface of the first work function control film 120 and the first work function control film 120 may not be exposed by the first lower gate electrode 130. The first lower gate electrode 130 may include a material that increases adhesion between the first work function control film 120 and the first upper gate electrode 140. The first lower gate electrode 130 may include, for example, TiN.

The first upper gate electrode 140 may be formed on the first lower gate electrode 130. In some embodiments, a lower surface of the first upper gate electrode 140 may directly contact the first lower gate electrode 130. The first upper gate electrode 140 may extend only a portion of the first trench 155 in a direction X, such that a sidewall of the first upper gate electrode 140 and an inner sidewall of the first gate spacer 150 may define a space. The first upper gate electrode 140 may expose a portion of an upper surface of the first lower gate electrode 130 that is adjacent a sidewall of the first upper gate electrode 140. A first width of the first lower gate electrode 130 may be greater than a second width of the first upper gate electrode 140 adjacent an interface between the first lower gate electrode 130 and the first upper gate electrode 140. The first and second widths are a width in the direction X.

The sidewall of the first upper gate electrode 140 may be gently curved as illustrated in FIGS. 1 through 3. However, the sidewall of the first upper gate electrode 140 may have various shapes. In some embodiments, the sidewall of the first upper gate electrode 140 may be straight. The first upper gate electrode 140 may include a material having an etching selectivity with respect to the first lower gate electrode 130 and may include, for example, tungsten (W).

The first upper gate electrode 140 may include a bottom portion 142 and a top portion 144. The bottom portion 142 of the first upper gate electrode 140 may be disposed in the first lower gate electrode 130, such that the first lower gate electrode 130 may cover a sidewall of the bottom portion 142 of the first upper gate electrode 140. That is, a portion of the first lower gate electrode 130 may be disposed between the sidewall of the first upper gate electrode 140 and the inner sidewall of the first gate spacer 150 and may overlap the bottom portion 142 of the first upper gate electrode 140 in a direction Z. The top portion 144 of the first upper gate electrode 140 may be disposed on the bottom portion 142 of the first upper gate electrode 140 and the first lower gate electrode 130 may expose a sidewall of the top portion 144 of the first upper gate electrode 140.

An uppermost surface of the first upper gate electrode 140 may be lower than an uppermost surface of the first gate spacer 150 relative to an upper surface of the substrate 100. That is, the uppermost surface of the first upper gate electrode 140 may be recessed from the uppermost surface of the first gate spacer 150.

The first air-gap spacer 160 may be disposed between the inner sidewall of the first gate spacer 150 and the sidewall the first upper gate electrode 140. In some embodiments, the first air-gap spacer 160 may overlap only the sidewall of the top portion 144 of the first upper gate electrode 140 and may not overlap a sidewall of the bottom portion 142 of the first upper gate electrode 140. Therefore, a thickness of the first air-gap spacer 160 in the direction Z may be less than a thickness of the first upper gate electrode 140 in the direction Z.

In some embodiments, the first air-gap spacer 160 may directly contact the inner sidewall of the first gate spacer 150 and the sidewall of the first upper gate electrode 140. The first air-gap spacer 160 may directly contact only the sidewall of the top portion 144 of the first upper gate electrode 140. The first air-gap spacer 160 may also directly contact an upper surface of the first lower gate electrode 130 but may not contact the first work function control film 120 since the first lower gate electrode 130 may cover the entire upper surface of the first work function control film 120.

Although "air-gap" is described herein in embodiments according to the present inventive concept, a gap may be defined, for example, as any void or cavity, and may be a gap filled with air (e.g., an air-gap), a gap filled with an inert gas or gases (e.g., an inert gas gap), a gap defining a vacuum (e.g., a vacuum gap), etc. As appreciated by the present inventive entity, the "air-gap" may be any type of gap that promotes reduced parasitic capacitance due to coupling between immediately adjacent structures.

The first capping pattern 170 may be formed in the first trench 155 by filling an upper portion of the first trench 155. The first capping pattern 170 may be formed on the first upper gate electrode 140 and the first air-gap spacer 160. Therefore, the first air-gap spacer 160 may be surrounded by the first lower gate electrode 130, the first upper gate electrode 140, the first gate spacer 150 and the first capping pattern 170. That is, the first upper gate electrode 140 and the first gate spacer 150 may define both sides the first air-gap spacer 160, and the first lower gate electrode 130 and the first capping pattern 170 may define bottom and top surfaces of the first air-gap spacer 160.

An uppermost surface of the first capping pattern 170 may be coplanar with the upper surface of the first gate spacer 150. In some embodiments, only a portion of the first capping pattern 170 may be in the first trench 155, and the uppermost surface of the first capping pattern 170 may be higher than the upper surface of the first gate spacer 150 relative to the upper surface of the substrate 100. The inner sidewall of the first gate spacer 150 may contact the first capping pattern 170, the first air-gap spacer 160, the first lower gate electrode 130, the first work function control film 120 and the first gate insulation film 110. In some embodiments, the first contact 180 may be formed by a self aligned contact (SAC) process and the first capping pattern 170 may include a material having an etching selectivity with respect to the first and second interlayer dielectric films 182 and 184. The first capping pattern 170 may include, for example, silicon nitride, silicon oxynitride and/or silicon oxide.

The second interlayer dielectric film 184 may be formed on the first interlayer dielectric film 182. The second interlayer dielectric film 184 may cover upper surfaces of the first capping pattern 170 and the first gate spacer 150. The second interlayer dielectric film 184 may include, for example, a low-k material, oxide, nitride, and/or oxynitride. The second interlayer dielectric film 184 may include a material having an etching selectivity with respect to both the first gate spacer 150 and the first capping pattern 170.

The first contact 180 may be formed in the first and second interlayer dielectric films 182 and 184. The first contact 180 may be disposed adjacent the first gate spacer 150. The first contact 180 may be, for example, formed by a self aligned contact (SAC) process. That is, the first contact 180 may be aligned by the first capping pattern 170 and the first gate spacer 150 that having an etching selectivity with respect to the first and second interlayer dielectric films 182 and 184. The first contact 180 may at least partially overlap the upper surfaces of the first gate spacer 150 and first capping pattern 170. In some embodiments, the first contact 180 may contact the upper surfaces of the first gate spacer 150 and first capping pattern 170. The first contact 180 may include, for example, at least one of aluminum (Al), tungsten (W) and copper (Cu).

Referring to FIG. 3, an upper portion of the first gate spacer 150 contacting the first contact 180 may have a sloped sidewall. Accordingly, the upper portion of the first gate spacer 150 contacting the first contact 180 may have a thickness less than a thickness of side portion of the first gate spacer 150. Therefore, parasitic capacitance between the first contact 180 and the first upper gate electrode 140 may be high around the upper portion of the first gate spacer 150. However, since the first air-gap spacer 160 is formed between the first gate spacer 150 and the top portion 144 of the first upper gate electrode 140, parasitic capacitance between the first contact 180 and the first upper gate electrode 140 may be reduced and thus the operating performance of the semiconductor device 1 may be improved. Additionally, since the first air-gap spacer 160 is between the first contact 180 and the first upper gate electrode 140, leakage current between the first contact 180 and the first upper gate electrode 140 may be reduced. Accordingly, reliability of the semiconductor device 1 may be improved.

Although "gate electrode" is described to illustrate some embodiments, the first lower gate electrode 130 and the first upper gage electrode 140 may be any conductive patterns included in a semiconductor device according to some embodiment of the present inventive concept, for example, bit lines or interlayer interconnection lines.

Figure 4:
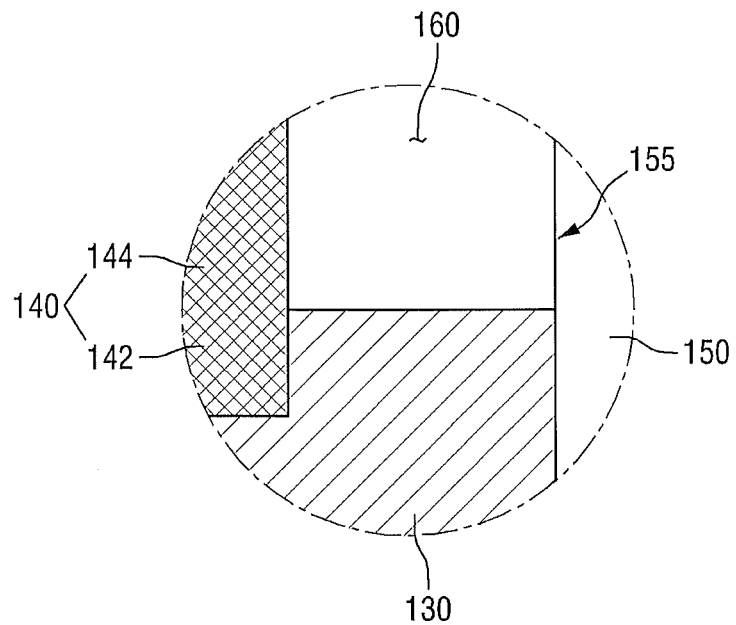
FIGS. 4 and 5 are enlarged views of a portion 'P' in FIG. 2.
Figure 5:
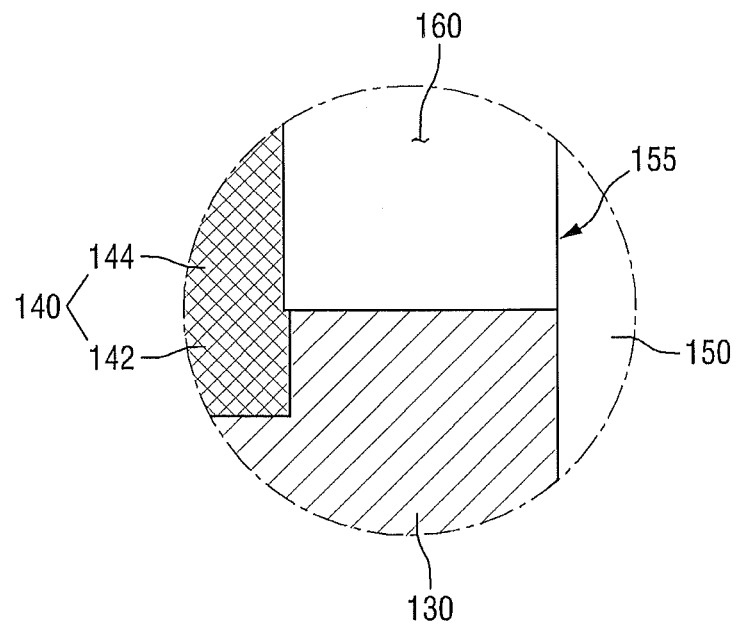

FIGS. 4 and 5 are enlarged views of a portion 'P' in FIG. 2. Referring to FIG. 4, a side of the first air-gap spacer 160 adjacent the first upper gate electrode 140 and a sidewall of the first lower gate electrode 130 adjacent the first upper gate electrode 140 may form a planar surface. That is, an interface between the top portion 144 of the first upper gate electrode 140 and the first air-gap spacer 160 and an interface between the bottom portion 142 of the first upper gate electrode 140 and the first lower gate electrode 130 may form a planar surface. In addition, an interface between the first gate spacer 150 and the first air-gap spacer 160 and an interface between the first gate spacer 150 and the first lower gate electrode 130 may form a planar surface. Therefore, a width of the first air-gap spacer 160 and a width of the first lower gate electrode 130 at an interface therebetween may be substantially the same.

Referring to FIG. 5, the side of the first air-gap spacer 160 adjacent the first upper gate electrode 140 and the sidewall of the first lower gate electrode 130 adjacent the first upper gate electrode 140 may form a stepped surface. The sidewall of the top portion 144 of the first upper gate electrode 140 and the sidewall of the bottom portion 142 of the first upper gate electrode 140 may have a stepped surface when a portion of the sidewall of the first upper gate electrode 140 is recessed while the first air-gap spacer 160 is formed. A width of the first air-gap spacer 160 may be greater than a width of the first lower gate electrode 130 at an interface therebetween. While FIG. 5 illustrated that the first upper gate electrode 140 is recessed, the present inventive concept is not limited thereto. In some embodiments, a portion of the sidewall of the first gate spacer 150 may be also recessed.

Figure 6:
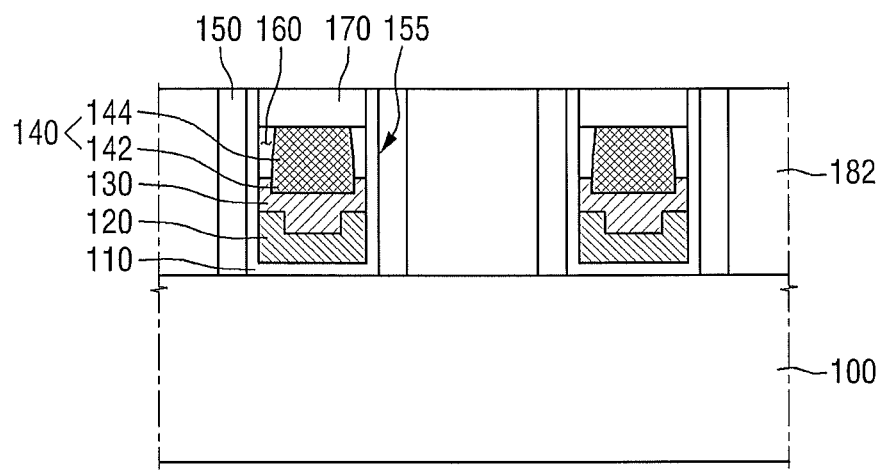
FIGS. 6 through 9 are cross-sectional views illustrating a semiconductor device according to some embodiments of the present inventive concept.

FIGS. 6 through 9 are cross-sectional views illustrating a semiconductor device according to some embodiments of the present inventive concept. Referring to FIG. 6, the first gate spacer 150 may be formed on the substrate 100. The pair of the first gate spacers 150 may define the first trench 155. The first gate insulation film 110 may be formed along the sidewall and the bottom surface of the first trench 155. The first gate insulation film 110 may be formed directly on the entire sidewall of the first trench 155.

The first work function control film 120 may be formed in the first trench 155. Specifically, the first work function control film 120 may be formed on the first gate insulation film 110 while covering a portion of a sidewall of the first gate insulation film 110. A sidewall of the first work function control film 120 may contact the portion of the sidewall of the first gate insulation film 110 and a bottom surface of the first work function control film 120 may contact the first gate insulation film 110. The first lower gate electrode 130 may be formed on the first work function control film 120 and on a portion of the sidewall of the first gate insulation film 110.

The first air-gap spacer 160 may be formed between the first upper gate electrode 140 and the first gate spacer 150. In detail, the first air-gap spacer 160 may be formed between the sidewall of the first upper gate electrode 140 and the sidewall of the first gate insulation film 110. The first air-gap spacer 160 may contact the top portion 144 of the first upper gate electrode 140 and the first gate insulation film 110. The first air-gap spacer 160 may not contact the first gate spacer 150.

The first capping pattern 170 may be formed by filling an upper portion of the first trench 155. The first gate insulation film 110 may be formed on the entire sidewall of the first trench 155 and thus the first capping pattern 170 may contact the first gate insulation film 110. An uppermost surface of the first gate insulation film 110 may be coplanar with an uppermost surface of the first capping pattern 170. Unless an entire upper surface of the first gate spacer 150 is etched by thermal erosion during a self aligned contact (SAC) process, after the SAC process the uppermost surface of the first gate insulation film 110, the uppermost surface of the first capping pattern 170 and an uppermost surface of the first gate spacer 150 may be coplanar. That is, when at least a portion of the upper surface of the first gate spacer 150 remains after the SAC process, the uppermost surface of the first gate insulation film 110, the uppermost surface of the first capping pattern 170 and the uppermost surface of the first gate spacer 150 may be coplanar.

The sidewall of the first upper gate electrode 140 and the sidewall of the first gate insulation film 110 may define sides of the first air-gap spacer 160, and an upper surface of the first lower gate electrode 130 and a lower surface of the first capping pattern 170 may define a bottom surface and a top surface of the first air-gap spacer 160, respectively. The first air-gap spacer 160 may be surrounded by the first upper gate electrode 140, the first lower gate electrode 130, the first gate insulation film 110 and the first capping pattern 170.

In some embodiments, the sidewall of the first gate insulation film 110 may contact the first capping pattern 170, the first air-gap spacer 160, the first lower gate electrode 130 and the first work function control film 120.

Figure 7:
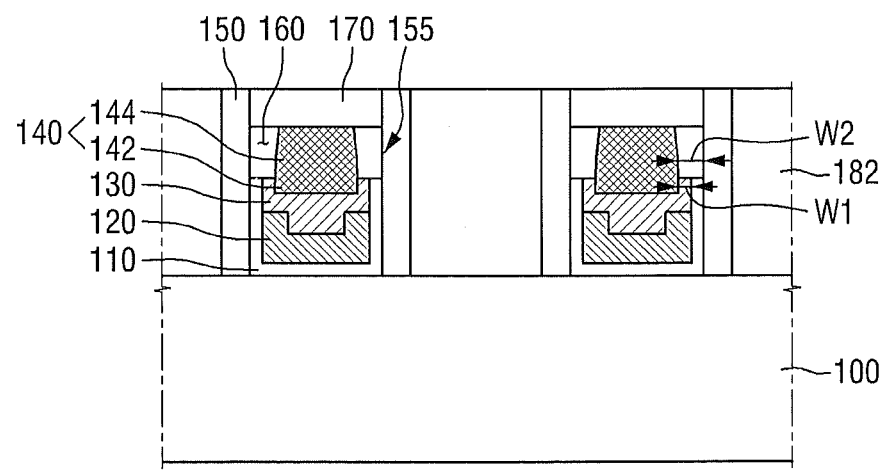

Referring to FIG. 7, the first gate insulation film 110 may be formed on, the bottom surface of the first trench 155 and only on a portion of the sidewall of a first trench 155. That is, the first gate insulation film 110 may cover the portion of the sidewall of the first trench 155 and may expose a remaining portion of the sidewall of the first trench 155. The first air-gap spacer 160 may be formed between the first upper gate electrode 140 and the first gate spacer 150 and may contact the top portion 144 of the first upper gate electrode 140 and the inner sidewall of the first gate spacer 150.

A bottom of the first air-gap spacer 160 may contact both uppermost surfaces of the first lower gate electrode 130 and the first gate insulation film 110. Accordingly, the bottom surface of the first air-gap spacer 160 may be defined by the uppermost surfaces of the first gate insulation film 110 and the first lower gate electrode 130. The first air-gap spacer 160 may be surrounded by the first upper gate electrode 140, the first lower gate electrode 130, the first gate insulation film 110, the first capping pattern 170 and the first gate spacer 150.

In some embodiments, the uppermost surface of the first lower gate electrode 130 may be coplanar with the uppermost surface of the first gate insulation film 110 as illustrated in FIG. 7. That is, the uppermost surface of the first lower gate electrode 130 and the uppermost surface of the first gate insulation film 110 may be at an equal level relative to the upper surface of the substrate 100. However, the present inventive concept is not limited thereto. In some embodiments, the uppermost surface of the first gate insulation film 110 may protrude from or be recessed with respect to the uppermost surface of the first lower gate electrode 130.

The first gate spacer 150 may contact the first capping pattern 170, the first air-gap spacer 160 and the first gate insulation film 110. The first air-gap spacer 160 may contact the top portion 144 of the first upper gate electrode 140 and the first gate spacer 150. The first lower gate electrode 130 may contact the bottom portion 142 of the first upper gate electrode 140 and the first gate insulation film 110.

A first width of the first lower gate electrode 130 W1 may be less than a second width of the first air-gap spacer 160 W2 adjacent an interface between the first air-gap spacer 160 and the first lower gate electrode 130 since the first gate insulation film 110 is formed between the inner sidewall of the first trench 155 and the first lower gate electrode 130. A difference between the first width W1 and the second width W2 may be the same as or greater than a thickness of the first gate insulation film 110 formed on the sidewall of the first trench 155.

Figure 8:
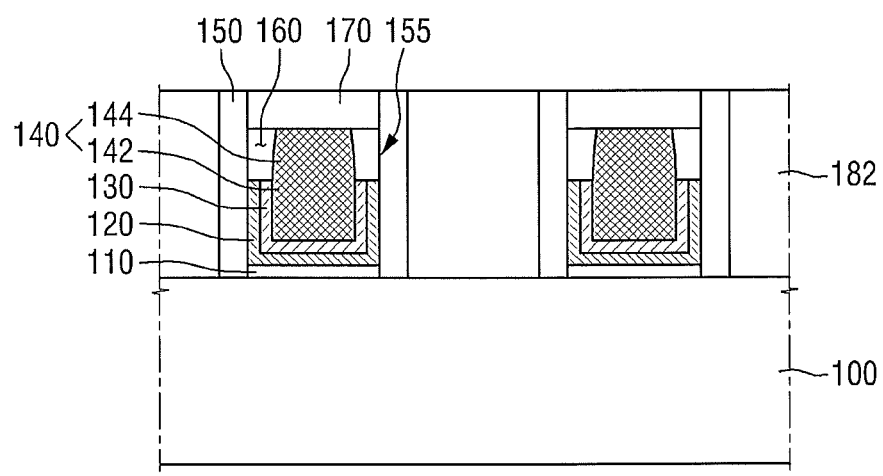

Referring to FIG. 8, the first gate insulation film 110 is formed on the bottom surface of a first trench 155, and the first work function control film 120 is formed on the first gate insulation film 110 and a sidewall of a first trench 155. A first lower gate electrode 130 is formed on the first work function control film 120 along a profile of the first work function control film 120 while exposing an uppermost surface of the first work function control film 120.

In some embodiments, a gate structure of the semiconductor device 4 may include an NMOS transistor and the first work function control film 120 may include an n-type work function control film. In some embodiments, the gate structure of the semiconductor device 4 may be a PMOS transistor and the first work function control film 120 may include a p-type work function control film or a stacked structure including a p-type work function control film and an n-type work function control film stacked on the p-type work function control film.

The first air-gap spacer 160 may contact both uppermost surfaces of the first lower gate electrode 130 and the first work function control film 120. The uppermost surfaces of the first lower gate electrode 130 and the first work function control film 120 may define a bottom surface of the first air-gap spacer 160. The first air-gap spacer 160 may be surrounded by the first upper gate electrode 140, the first lower gate electrode 130, the first work function control film 120, the first capping pattern 170 and the first gate spacer 150. The first gate spacer 150 may contact the first capping pattern 170, the first air-gap spacer 160, the first work function control film 120 and the first gate insulation film 110.

The first gate insulation film 110 may be formed on the bottom surface of the first trench 155 while exposing the sidewall of the first trench 155 as illustrated in FIG. 8. However, the present inventive concept is not limited thereto. In some embodiments, the first gate insulation film 110 may be formed on the bottom surface of the first trench 155 and a portion of the sidewall of the first trench 155, as illustrated in FIGS. 6 and 7.

Figure 9:
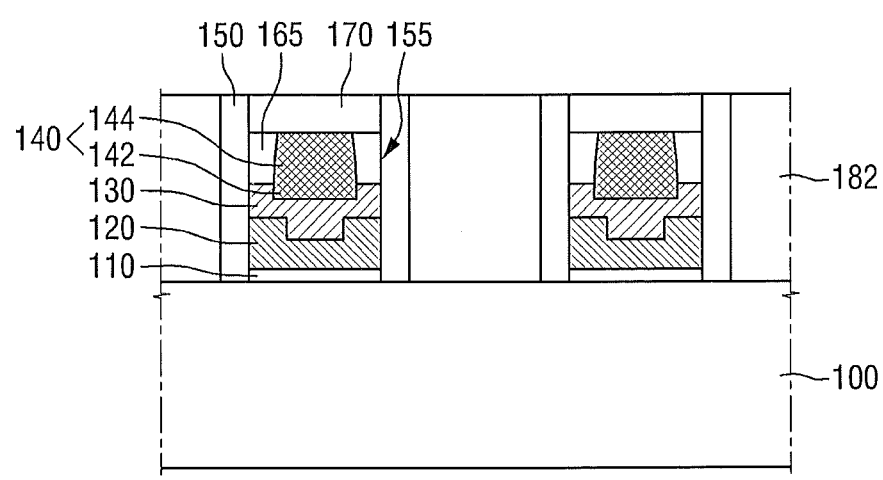

Referring to FIG. 9, the semiconductor device 5 may include an insertion pattern 165 in the first air-gap spacer 160. The insertion pattern 165 may be formed between the first gate spacer 150 and the first upper gate electrode 140 and may overlap the top portion 144 of the first upper gate electrode 140. The insertion pattern 165 may contact a sidewall of the top portion 144 of the first upper gate electrode 140, the first gate spacer 150, and an uppermost surface the first lower gate electrode 130. A sidewall of the insertion pattern 165 adjacent the first upper gate electrode 140 and a sidewall of the first lower gate electrode 130 adjacent the first upper gate electrode 140 may form a planar surface.

The insertion pattern 165 may include a material having a dielectric constant different from a dielectric constant of the first gate spacer 150. However, the present inventive concept is not limited thereto. In some embodiments, the dielectric constant of the insertion pattern 165 may have a dielectric constant smaller than a dielectric constant of the first gate spacer 150. The insertion pattern 165 may be formed by filling a space between the sidewall of the first upper gate electrode 140 and the inner sidewall of the first gate spacer 150. Thus, the insertion pattern 165 may include a material having good gap-fill capability. For example, the insertion pattern 165 may include SiCN, SiBCN, or SiOCN and the insertion pattern 165 may be formed by an atomic layer deposition (ALD) process. In some embodiments, the insertion pattern 165 may include an air-gap formed during a process of filling the space between the sidewall of the first upper gate electrode 140 and the sidewall of the first gate spacer 150.

In some embodiments, the first upper gate electrode 140 may directly contact the first capping pattern 170. However, the present inventive concept is not limited thereto. An intervening layer may be formed between the first upper gate electrode 140 and the first capping pattern 170.

FIGS. 10 through 13 are cross-sectional views illustrating a semiconductor device including a first region I and a second region II according to some embodiments of the present inventive concept. Referring to FIGS. 10 through 13, the semiconductor device includes the substrate 100 including the first region I and the second region II. The first region I may include a second gate structure and the second region II may include a third gate structure. In some embodiments, the second gate structure and the third gate structure may have different structures. The first region I and the second region II may be spaced apart from each other or may be connected to each other. In some embodiments, the second gate structure in the first region I may include an NMOS transistor and the third gate structure in the second region II may include a PMOS transistor. Alternatively, the second gate structure in the first region I may be a PMOS transistor and the third gate structure in the second region II may be an NMOS transistor.

Figure 10:
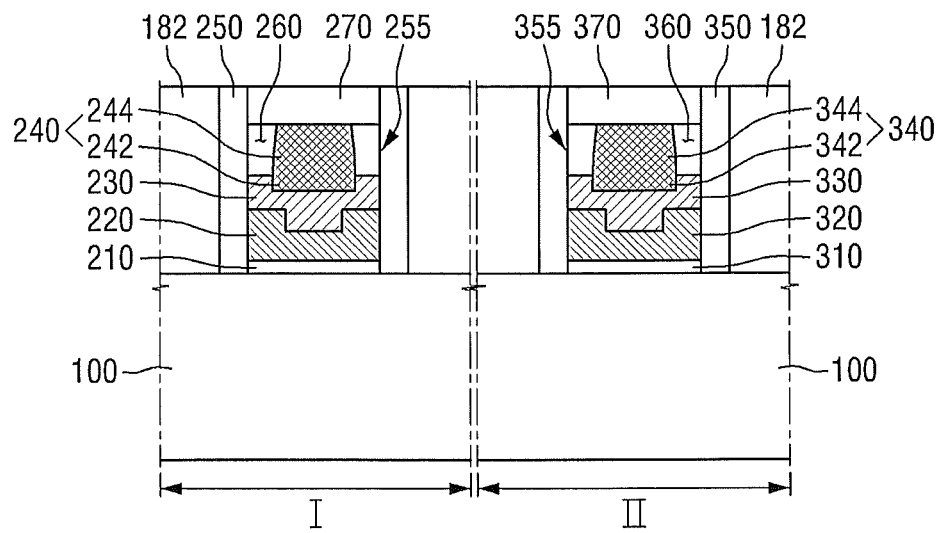
FIGS. 10 through 13 are cross-sectional views illustrating a semiconductor device including a first region I and a second region II according to some embodiments of the present inventive concept.

Referring to FIG. 10, the second gate structure in the first region I may include a second gate spacer 250, a second air-gap spacer 260, a second trench 255, a second lower gate electrode 230, a second upper gate electrode 240, and a second capping pattern 270. The third gate structure in the second region II may include a third gate spacer 350, a third air-gap spacer 360, a third trench 355, a third lower gate electrode 330, a third upper gate electrode 340 and a third capping pattern 370.

The second gate spacer 250 and the third gate spacer 350 may be formed on the first region I and the second region II of the substrate 100, respectively. The second gate spacer 250 may define the second trench 255 in the first region I and the third gate spacer 350 may define the third trench 355 in the second region II.

The second gate insulation film 210 and the third gate insulation film 310 may be formed on a bottom surface of the second trench 255 and a bottom surface of the third trench 355, respectively. The second gate insulation film 210 and the third gate insulation film 310 may expose portions of sidewalls of the second trench 255 and the third trench 355 as illustrated in FIG. 10. However, the present inventive concept is not limited thereto.

The second work function control film 220 may be formed on the second gate insulation film 210. The second work function control film 220 may be formed on the bottom surface of the second trench 255 and a portion of the sidewall of the second trench 255. The second work function control film 220 may include an n-type work function control film.

The third work function control film 320 may be formed on the third gate insulation film 310. The third work function control film 320 may be formed on the bottom surface of the third trench 355 and a portion of a sidewall of the third trench 355. The third work function control film 320 may include a p-type work function control film.

The second lower gate electrode 230 may be formed on the second work function control film 220 while covering a portion of the sidewall of the second trench 255. The third lower gate electrode 330 may be formed on the third work function control film 320 while covering a portion of the sidewall of the third trench 355. The second lower gate electrode 230 and the third lower gate electrode 330 may include the same material, for example, TiN.

The second upper gate electrode 240 may be formed on the second lower gate electrode 230 and may fill only a portion of the second trench 255. Accordingly, the second upper gate electrode 240 may expose a portion of an upper surface of the second lower gate electrode 230. The second upper gate electrode 240 may include a bottom portion 242 and a top portion 244. The bottom portion 242 of the second upper gate electrode 240 may be disposed in the second lower gate electrode 230, such that a sidewall of the bottom portion 242 of the second upper gate electrode 240 may be covered by the second lower gate electrode 230. That is, the second lower gate electrode 230 may overlap the sidewall of the bottom portion 242 of the second upper gate electrode 240. The second lower gate electrode 230 may expose the top portion 244 of the second upper gate electrode 240 and thus the second lower gate electrode 230 may not overlap the top portion 244 of the second upper gate electrode 240. A portion of the second lower gate electrode 230 may be disposed between the second upper gate electrode 240 and the second gate spacer 250.

The third upper gate electrode 340 may be formed on the third lower gate electrode 330 and may fill only a portion of the third trench 355. Accordingly, the third upper gate electrode 340 may expose a portion of an upper surface of the third lower gate electrode 330. The third upper gate electrode 340 may include a bottom portion 342 and a top portion 344. The bottom portion 342 of the third upper gate electrode 340 may be disposed in the third lower gate electrode 330, such that a sidewall of the bottom portion 342 of the third upper gate electrode 340 may be covered by the third lower gate electrode 330. That is, the third lower gate electrode 330 may overlap the sidewall of the bottom portion 342 of the third upper gate electrode 340. The third lower gate electrode 330 may expose the top portion 344 of the third upper gate electrode 340 and thus the third lower gate electrode 330 may not overlap the top portion 344 of the third upper gate electrode 340. A portion of the third lower gate electrode 330 may be disposed between the third upper gate electrode 340 and the third gate spacer 350. The second upper gate electrode 240 and the third upper gate electrode 340 may include the same material, for example, tungsten (W).

The second air-gap spacer 260 may be formed between the second gate spacer 250 and the second upper gate electrode 240 and may overlap the top portion 244 of the second upper gate electrode 240. The second air-gap spacer 260 may contact a sidewall of the top portion 244 of the second upper gate electrode 240. The third air-gap spacer 360 may be formed between the third gate spacer 350 and the third upper gate electrode 340 and may overlap the top portion 344 of the third upper gate electrode 340. The third air-gap spacer 360 may contact a sidewall of the top portion 344 of the third upper gate electrode 340.

The second air-gap spacer 260 and the third air-gap spacer 360 may contact the portion of the second lower gate electrode 230 and the portion of the third lower gate electrode 330 exposed by the second upper gate electrode 240 and the third upper gate electrode 340, respectively. In some embodiments, the second air-gap spacer 260 and the third air-gap spacer 360 may be concurrently formed and thus the second air-gap spacer 260 and the third air-gap spacer 360 may have substantially the same height. In addition, a width of the second air-gap spacer 260 at an interface between the second lower gate electrode 230 and the second air-gap spacer 260 may be substantially the same as a width of the third air-gap spacer 360 at an interface between the third lower gate electrode 330 and the third air-gap spacer 360.

The second capping pattern 270 may be formed on the second upper gate electrode 240 and the second air-gap spacer 260 by filling an upper portion of the second trench 255. The third capping pattern 370 may be formed on the third upper gate electrode 340 and the third air-gap spacer 360 by filling an upper portion of the third trench 355.

The semiconductor device 6 may include second and third contacts adjacent the second gate spacer 250 and the third gate spacer 350, respectively, as illustrated in FIG. 3. The second and third contacts may be formed using a self aligned contact (SAC) process.

Figure 11:
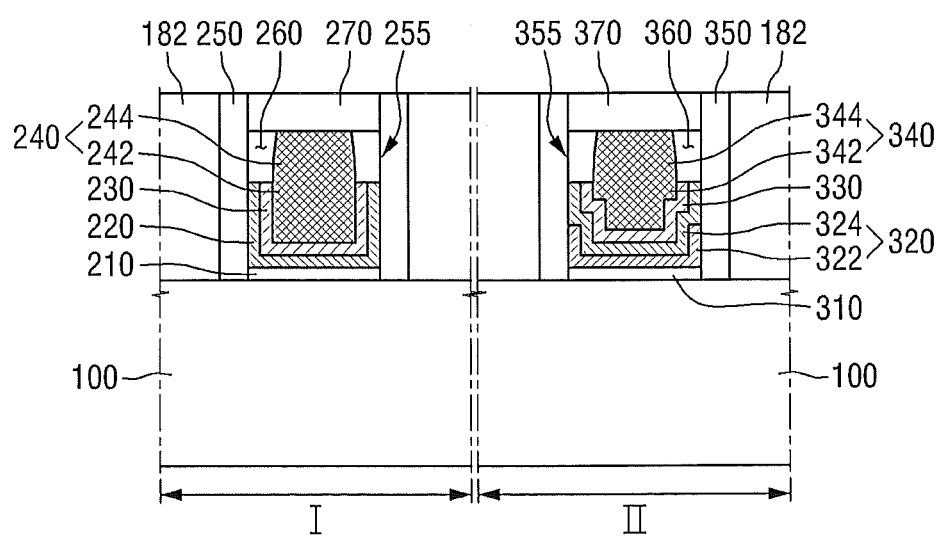

Referring to FIG. 11, the second gate insulation film 210 may be formed on the bottom surface of the second trench 255. The second work function control film 220 may be formed on the second gate insulation film 210 and on a portion of the sidewall of the second trench 255. The second lower gate electrode 230 may be formed on the second work function control film 220 along a profile of the second work function control film 220 while exposing an uppermost surface of the second work function control film 220.

The second air-gap spacer 260 may be formed between the second upper gate electrode 240 and the second gate spacer 250. The uppermost surface of the second work function control film 220 may contact a second air-gap spacer 260. Therefore, the uppermost surface of the second work function control film 220 and an uppermost surface of the second lower gate electrode 230 may define a bottom surface of the second air-gap spacer 260. In some embodiments, the second work function control film 220 may include only an n-type work function control film.

The third work function control film 320 may include a third lower work function control film 322 and a third upper work function control film 324. The third lower work function control film 322 may be formed on the third gate insulation film 310. The third lower work function control film 322 may be formed on a portion of the sidewall of the third trench 355 and on the bottom surface of the third trench 355. The third upper work function control film 324 may be formed on the third lower work function control film 322. The third upper work function control film 324 may be formed along a profile of the third lower work function control film 322 and may be formed on a portion of the sidewall of the third trench 355. The third upper work function control film 324 may contact a portion of the sidewall of the third gate spacer 350.

In some embodiments, the third upper work function control film 324 may cover an entire upper surface of the third lower work function control film 322 and thus the upper surface of the third lower work function control film 322 may not be exposed by the third upper work function control film 324. The third work function control film 320 may include a p-type work function control film and an n-type work function control film stacked on p-type work function control film. That is, the third lower work function control film 322 may include a p-type work function control film and the third upper work function control film 324 may include an n-type work function control film.

The third lower gate electrode 330 may be formed on the third work function control film 320, specifically on the third upper work function control film 324. The third lower gate electrode 330 may be formed along a profile of the third upper work function control film 324 while exposing an uppermost surface of the third upper work function control film 324.

The third air-gap spacer 360 may be formed between the third upper gate electrode 340 and the third gate spacer 350. The uppermost surface of the third upper work function control film 324 may contact the third air-gap spacer 360. Therefore, the third upper work function control film 324 and the third lower gate electrode 330 may define the bottom surface of the third air-gap spacer 360.

In some embodiments, the second work function control film 220 and the third upper work function control film 324 may be formed using same manufacturing processes. Additionally, the second lower gate electrode 230 and the third lower gate electrode 330 may be formed using same manufacturing processes. Accordingly, the second work function control film 220 and the third upper work function control film 324 may have substantially the same thickness, and the second lower gate electrode 230 and the third lower gate electrode 330 may have substantially the same thickness. Therefore, a lowermost portion of the second air-gap spacer 260 adjacent an interface between the top portion 244 of the second upper gate electrode 240 and the bottom portion 242 of the second upper gate electrode 240 may has a width substantially the same as a width of a lowermost portion of the third air-gap spacer 360 adjacent an interface between the top portion 344 of the third upper gate electrode 340 and the bottom portion 342 of the third upper gate electrode 340.

The second gate spacer 250 may contact the second capping pattern 270, the second air-gap spacer 260, the second work function control film 220 and the second gate insulation film 210. The third gate spacer 350 may contact the third capping pattern 370, the third air-gap spacer 360, the third upper work function control film 324, the third lower work function control film 322 and the third gate insulation film 310.

Figure 12:
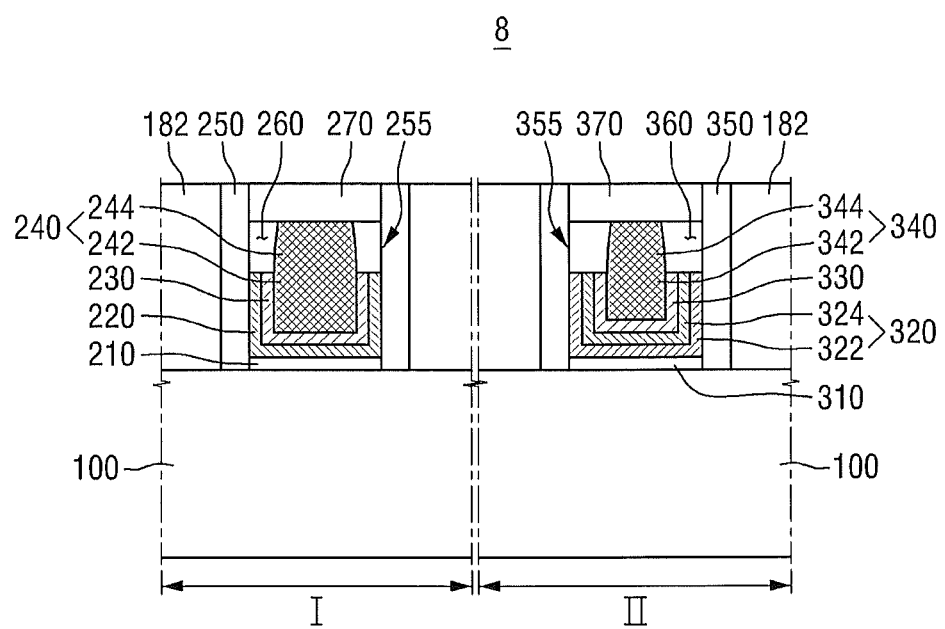

Referring to FIG. 12, the second gate structure in the first region I may be the same as or similar to the second gate structure illustrated in FIG. 11. The third gate structure in the second region II may include the third gate insulation film 310 formed on the bottom surface of the third trench 355. The third lower work function control film 322 may be formed on the third gate insulation film 310 and on a portion of the sidewall of the third trench 355. The third upper work function control film 324 may be formed on the third lower work function control film 322 along a profile of the third lower work function control film 322. The third lower gate electrode 330 may be formed on the third upper work function control film 324 along a profile of the third upper work function control film 324. In some embodiments, the third lower work function control film 322, the third upper work function control film 324 and the third lower gate electrode 330 may be conformally formed on underlying layers.

A third air-gap spacer 360 may be formed between the third upper gate electrode 340 and the third gate spacer 350. Uppermost surfaces of the third upper work function control film 324 and the third lower work function control film 322 may contact a third air-gap spacer 360. Therefore, the uppermost surfaces of the third lower work function control film 322, the third upper work function control film 324 and the third lower gate electrode 330 may define a bottom surface of the third air-gap spacer 360.

A lowermost portion of the second air-gap spacer 260 adjacent an interface between the top portion 244 of the second upper gate electrode 240 and the bottom portion 242 of the second upper gate electrode 240 may have a width smaller than a width of a lowermost portion of the third air-gap spacer 360 adjacent an interface between the top portion 344 of the third upper gate electrode 340 and the bottom portion 342 of the third upper gate electrode 340. Accordingly, when the second trench 255 and the third trench 355 have the same or similar width, a width of the second upper gate electrode 240 may be greater than a width of the third upper gate electrode 340. A difference between the width of the lowermost portion of the second air-gap spacer 260 and the width of the lowermost portion of the third air-gap spacer 360 may be substantially the same as a thickness of the third lower work function control film 322. The third gate spacer 350 may contact the third capping pattern 370, the third air-gap spacer 360, the third lower work function control film 322 and the third gate insulation film 310.

Figure 13:
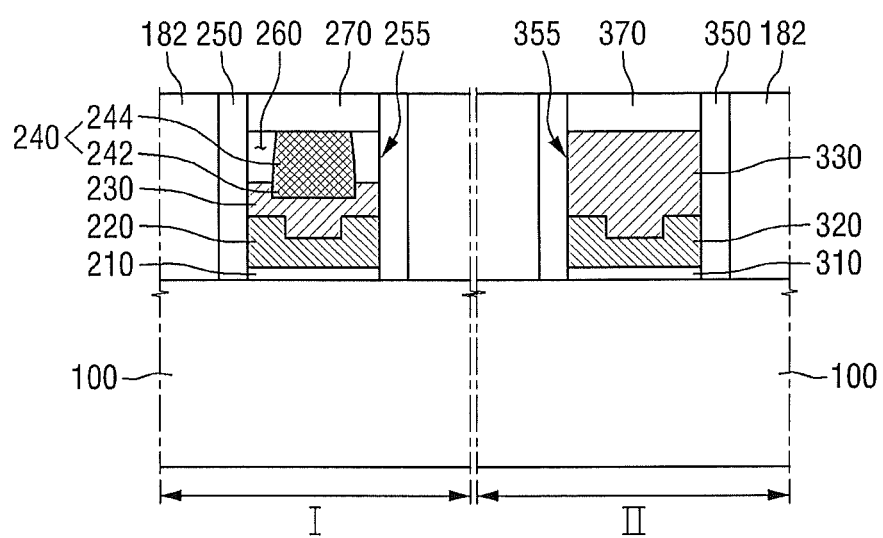

Referring to FIG. 13, the second gate structure in the first region I may be the same as or similar to the second gate structure illustrated in FIG. 10. The third gate structure in the second region II may include the third gate insulation film 310 formed on the bottom surface of the third trench 355. The third work function control film 320 may be formed on the third gate insulation film 310. The third work function control film 320 may be formed on the bottom surface of the third trench 355 and on a portion of the sidewall of the third trench 355. The third lower gate electrode 330 may be formed on the third work function control film 320 and may fill the third trench 355, such that the third gate structure may not include an air-gap spacer. An uppermost surface of the third lower gate electrode 330 may be planar and may contact a lower surface of the third capping pattern 370.

Figure 14:
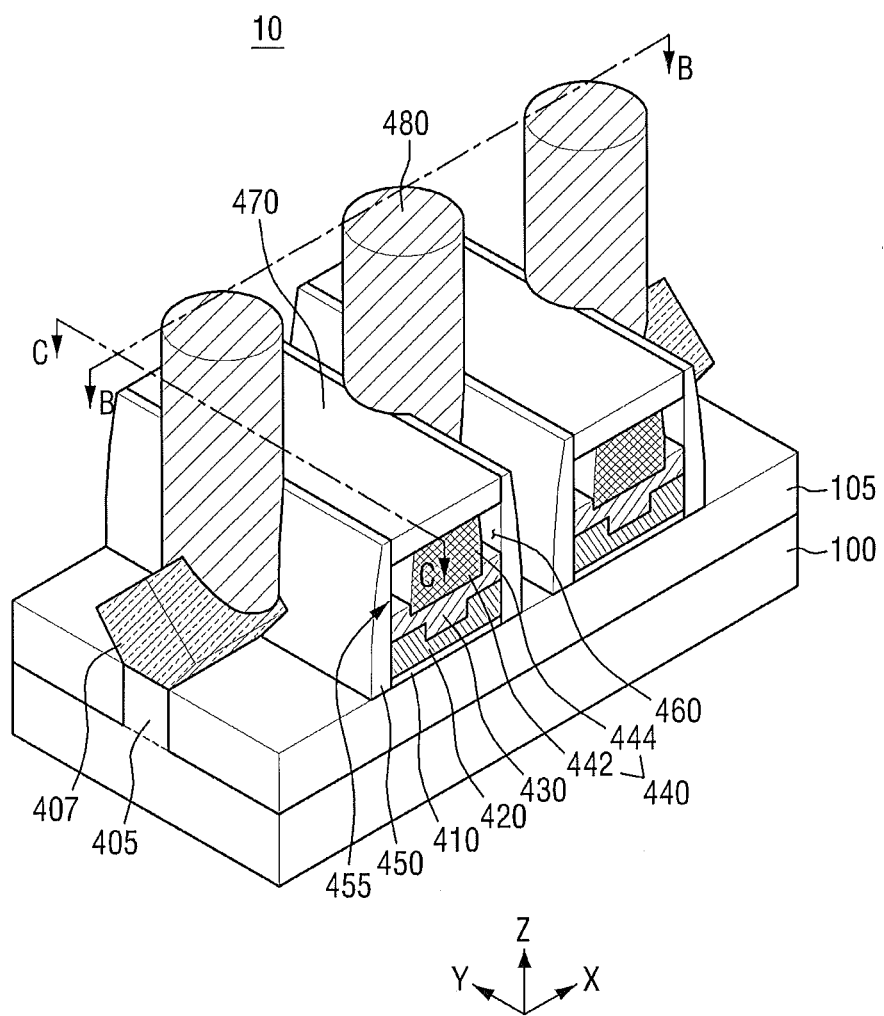
FIG. 14 is a perspective view illustrating a semiconductor device according to some embodiments of the present inventive concept.
Figure 15:
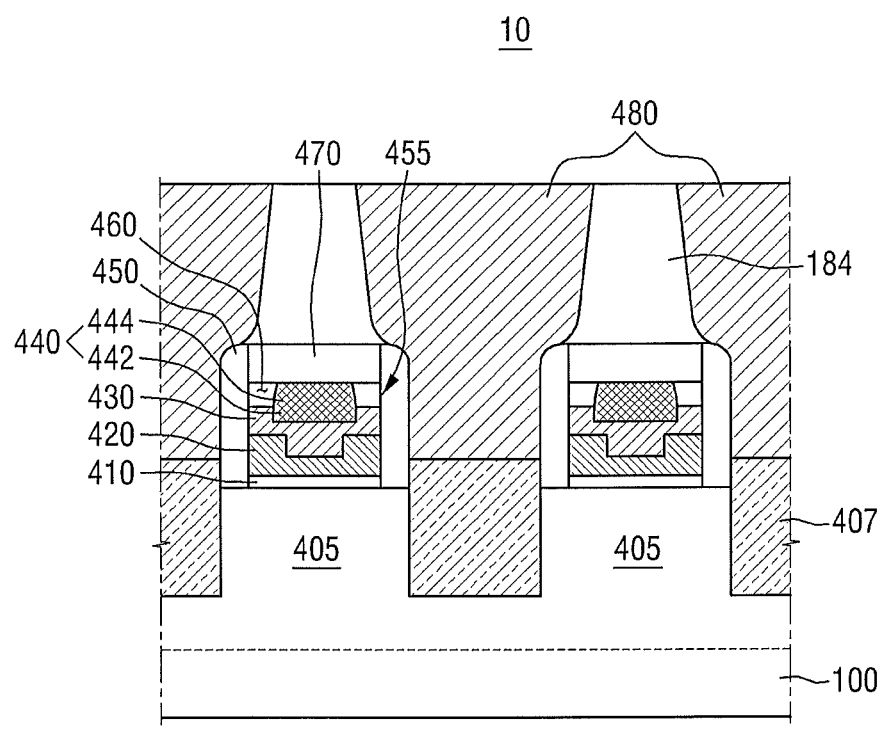
FIG. 15 is a cross-sectional view of the semiconductor device in FIG. 14 taken along line B-B.
Figure 16:
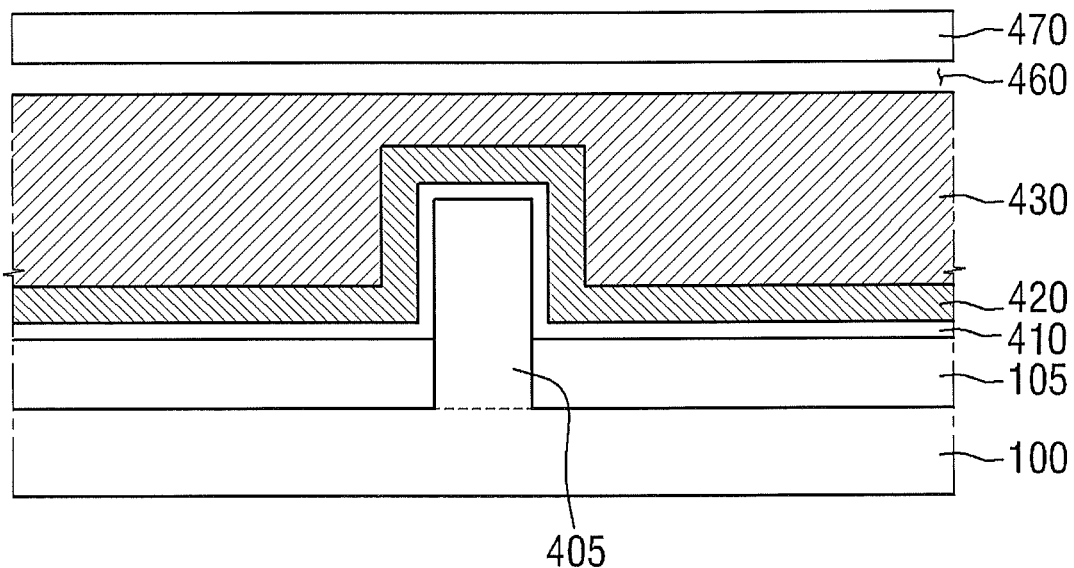
FIG. 16 is a cross-sectional view of the semiconductor device in FIG. 14 taken along line C-C.

FIG. 14 is a perspective view illustrating a semiconductor device according to some embodiments of the present inventive concept. FIG. 15 is a cross-sectional view of the semiconductor device in FIG. 14 taken along line A-A. FIG. 16 is a cross-sectional view of the semiconductor device in FIG. 14 taken along line B-B of FIG. 14.

Referring to FIGS. 14 and 15, the semiconductor device 10 includes a fourth gate structure on the substrate 100. The fourth gate structure may include a fin type active pattern 405, a fourth gate spacer 450, a fourth air-gap spacer 460, a fourth trench 455, a fourth lower gate electrode 430, a fourth upper gate electrode 440, a fourth capping pattern 470, and a fourth contact 480.

The fin type active pattern 405 may protrude from the substrate 100. The field insulation film 105 formed on the substrate 100 may cover a portion of a sidewall of the fin type active pattern 405. In some embodiments, the fin type active pattern 405 may protrude from an upper surface of the field insulation film 105.

The fin type active pattern 405 may extend in the direction X. The fin type active pattern 405 may be a portion of the substrate 100 and may include an epitaxial layer that is grown using the substrate 100 as a seed layer.

The fin type active pattern 405 may include, for example, a semiconductor element, such as silicon or germanium. The fin type active pattern 405 may include a compound semiconductor, for example, a Group IV-IV compound semiconductor or a Group III-V compound semiconductor. In some embodiments, the fin type active pattern 405 formed of, for example, the Group IV-IV compound semiconductor, may be a binary compound, a ternary compound or a compound doped with the Group V element including at least two or more of carbon (C), silicon (Si), germanium (G), and tin (Sn). The fin type active pattern 405 formed of, for example, the Group III-V compound semiconductor, may be a binary compound, a ternary compound or a quaternary compound formed by combining the at least one Group III element including at least one of aluminum (Al), gallium (Ga) and indium (In) with the at least one Group V element including phosphorus (P), arsenic (As), and antimony (Sb).

A fourth gate spacer 450 may be formed on the fin type active pattern 405. The fourth gate spacer 450 may extend in the direction Y and may be formed to cross over the fin type active pattern 405. The fourth trench 455 may be defined by the fourth gate spacer 450, such that the fourth trench 455 may extend in the direction Y.

The fourth gate insulation film 410 may be formed on the bottom surface of the fourth trench 455 while exposing a portion of a sidewall of the fourth gate spacer 450. The fourth work function control film 420 may be formed on the fourth gate insulation film 410. The fourth work function control film 420 may be formed on a portion of the sidewall of the fourth trench 455 and on the bottom surface of the fourth trench 455.

The fourth lower gate electrode 430 may be formed on the fourth work function control film 420. Specifically, the fourth lower gate electrode 430 may be formed on an upper surface the fourth work function control film 420 and a portion of the sidewall of the fourth trench 455. The fourth lower gate electrode 430 may include, for example, TiN.

The fourth upper gate electrode 440 may be formed on the fourth lower gate electrode 430 and may fill only a portion of the fourth trench 455 in the direction X. Accordingly, the fourth upper gate electrode 440 may expose a portion of an upper surface of the fourth lower gate electrode 430. The fourth upper gate electrode 440 may include a bottom portion 442 and a top portion 444. The bottom portion 442 of the fourth upper gate electrode 440 may be disposed in the fourth lower gate electrode 430, such that a sidewall of the bottom portion 442 of the fourth upper gate electrode 440 may be covered by the fourth lower gate electrode 430. That is, the fourth lower gate electrode 430 may overlap the sidewall of the bottom portion 442 of the fourth upper gate electrode 440. The fourth lower gate electrode 430 may expose the top portion 444 of the fourth upper gate electrode 440 and thus the fourth lower gate electrode 430 may not overlap the top portion 444 of the fourth upper gate electrode 440. A portion of the fourth lower gate electrode 430 may be disposed between the fourth upper gate electrode 440 and the fourth gate spacer 450. The fourth upper gate electrode 440 may include a material having an etching selectivity with respect to the fourth lower gate electrode 430 and may include, for example, tungsten (W).

The fourth air-gap spacer 460 may be formed between the fourth gate spacer 450 and fourth upper gate electrode 440 and may overlap the top portion 444 of the fourth upper gate electrode 440. The fourth air-gap spacer 460 may contact the top portion 444 of the fourth upper gate electrode 440 and the portion of the upper surface of the fourth lower gate electrode 430. Additionally, the fourth air-gap spacer 460 may contact the fourth gate spacer 450.

In some embodiments, a side of the fourth air-gap spacer 460 and a sidewall of the fourth lower gate electrode 430 may form a planar surface, as illustrated in FIG. 5. However, the present inventive concept is not limited thereto. A width of the fourth air-gap spacer 460 at an interface between the fourth air-gap spacer 460 and the fourth lower gate electrode 430 may be greater than or substantially the same as a width of the fourth lower gate electrode 430 at the interface between the fourth air-gap spacer 460 and the fourth lower gate electrode 430.

The fourth capping pattern 470 may be formed on the fourth upper gate electrode 440 and the fourth air-gap spacer 460. The fourth capping pattern 470 may be formed by filling an upper portion of the fourth trench 455.

An elevated source/drain 407 may be formed adjacent an outer sidewall the fourth gate spacer 450 on the fin type active pattern 405. The elevated source/drain 407 may contact the outer sidewall of the fourth gate spacer 450. The elevated source/drain 407 may have various shapes, for example, a diamond shape, a circle shape or a rectangle shape.

In some embodiments, the fourth gate structure of the semiconductor device 10 may include a PMOS fin type transistor and the elevated source/drain 407 may include a compressive stress material. For example, the fin type active pattern 405 may include silicon, and the compressive stress material may be a material having a greater lattice constant than silicon (Si), for example, SiGe. The compressive stress material may apply a compressive stress to the fin type active pattern 405, thereby improving mobility of carriers in a channel region. In some embodiments, the fourth gate structure of the semiconductor device 10 may include an NMOS fin type transistor and the elevated source/drain 407 may include the same material as the fin type active pattern 405, or a tensile stress material. For example, the fin type active pattern 405 may include silicon, and the elevated source/drain 407 may be silicon or a material having a smaller lattice constant than silicon (Si), for example, SiC.

The fourth contact 480 may be formed adjacent the fourth gate spacer 450. The second contact 480 may be electrically connected to the elevated source/drain 407. The fourth contact 480 may be formed using, for example, a self aligned contact (SAC) process, such that the fourth contact 480 may partially overlap the upper surfaces of the fourth gate spacer 450 and first capping pattern 470. However, the present inventive concept is not limited thereto.

Referring to FIG. 16, the fin type active pattern 405 may protrude from an upper surface of the field insulation film 105 and the fourth gate insulation film 410 may be formed along profiles of the field insulation film 105 and the fin type active pattern 405.

The fourth work function control film 420 may be formed on the fourth gate insulation film 410. An upper surface of the fourth work function control film 420 on the fin type active pattern 405 may be higher than an upper surface of the fourth work function control film 420 on the field insulation film 105. The fourth lower gate electrode 430 may be formed on the fourth work function control film 420 and may have a substantially planar upper surface. The fourth air-gap spacer 460 may be disposed on the fourth lower gate electrode 430 and may extend in the direction Y. The fourth air-gap spacer 460 may have same thickness in the direction Z along the direction Y. That is, the fourth air-gap spacer 460 may not be formed along profiles of the field insulation film 105 and the fin type active pattern 405.

Figure 17:
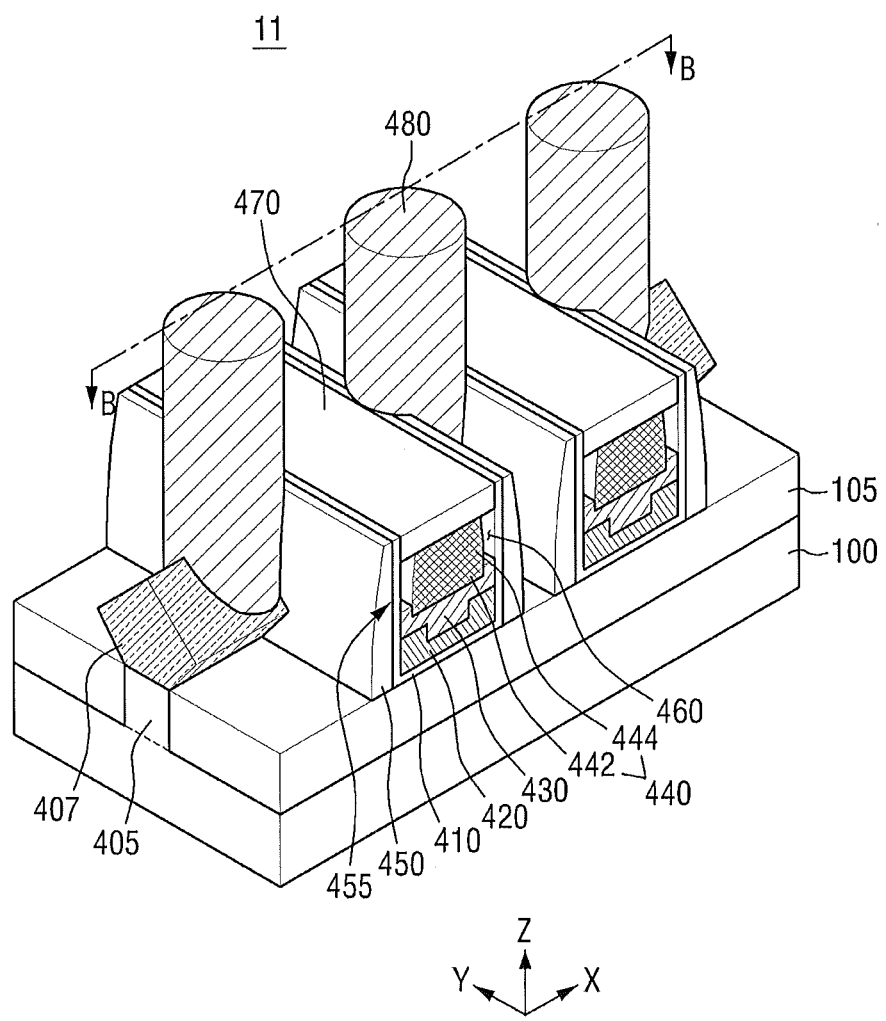
FIG. 17 is a perspective view illustrating a semiconductor device according to some embodiments of the present inventive concept.
Figure 18:
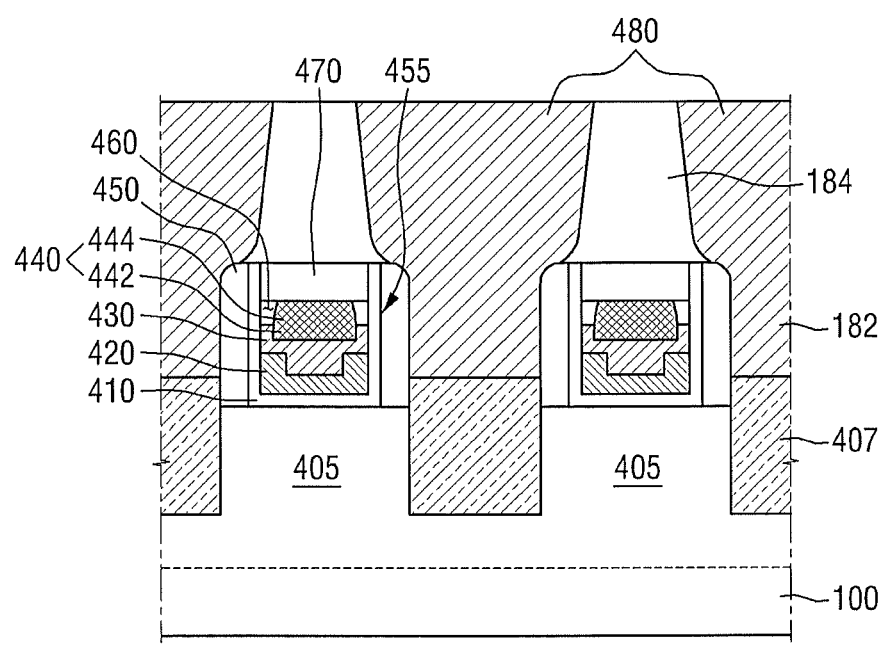
FIG. 18 is a cross-sectional view of the semiconductor device in FIG. 17 taken along line B-B.

FIG. 17 is a perspective view illustrating a semiconductor device according to some embodiments of the present inventive concept. FIG. 18 is a cross-sectional view of the semiconductor device in FIG. 17 taken along line B-B.

Referring to FIGS. 17 and 18, the fourth gate insulation film 410 may be formed along the sidewall and the bottom surface of the fourth trench 455. In some embodiments, the fourth gate insulation film 410 may be formed directly on the entire sidewall of the fourth trench 455 as illustrated in FIG. 18.

The fourth work function control film 420 may be formed in the fourth trench 455. Specifically, the fourth work function control film 420 may be formed on the fourth gate insulation film 410 while covering a portion of a sidewall of the fourth gate insulation film 410. The fourth lower gate electrode 430 may be formed on the fourth work function control film 420 and on a portion of the sidewall of the fourth gate insulation film 410. A sidewall of the fourth lower gate electrode 430 may contact the fourth gate insulation film 410.

The fourth air-gap spacer 460 may be formed between the fourth upper gate electrode 440 and the fourth gate spacer 450. The fourth air-gap spacer 460 may overlap a top portion 444 of the fourth upper gate electrode 440. The fourth air-gap spacer 460 may contact a sidewall of the top portion 444 of the fourth upper gate electrode 440 and the fourth gate insulation film 410. Therefore, the top portion 444 of the fourth upper gate electrode 440 and the fourth gate insulation film 410 may define sides of the fourth air-gap spacer 460. The fourth air-gap spacer 460 may not contact the fourth gate spacer 450 because the fourth gate insulation film 410 is disposed between the fourth air-gap spacer 460 and the fourth gate spacer 450.

Figure 19:
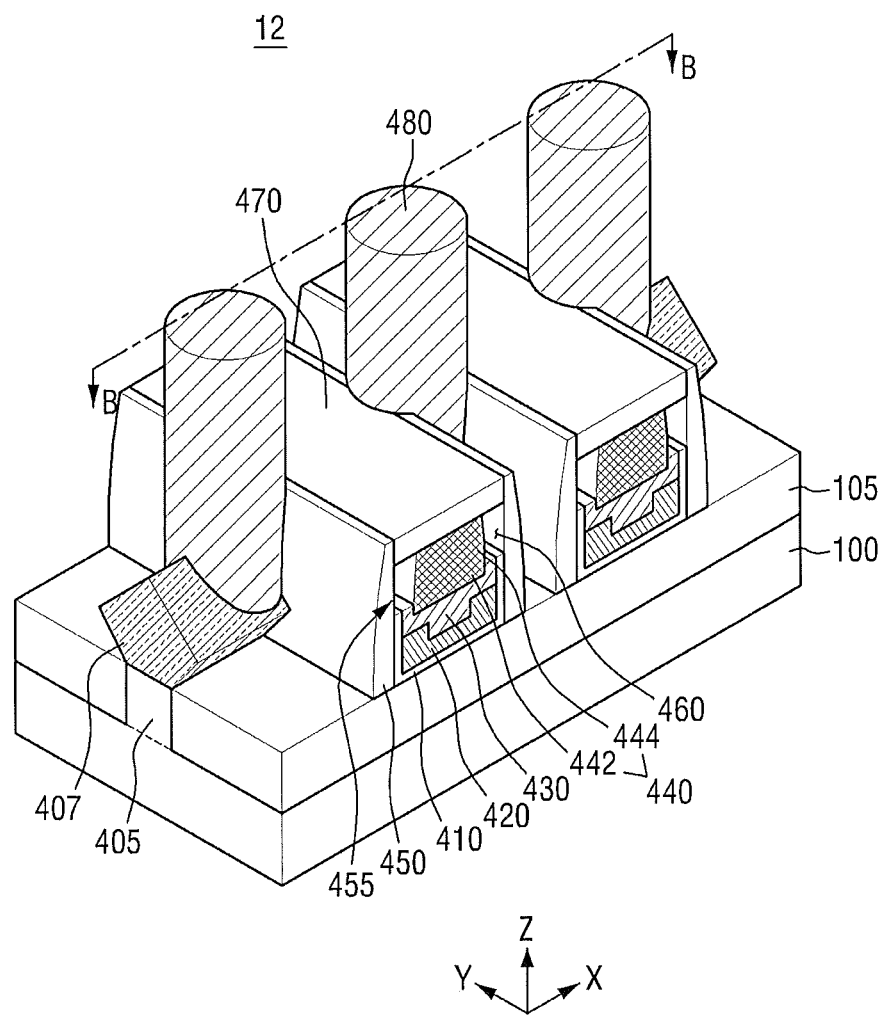
FIG. 19 is a perspective view illustrating a semiconductor device according to some embodiments of the present inventive concept.
Figure 20:
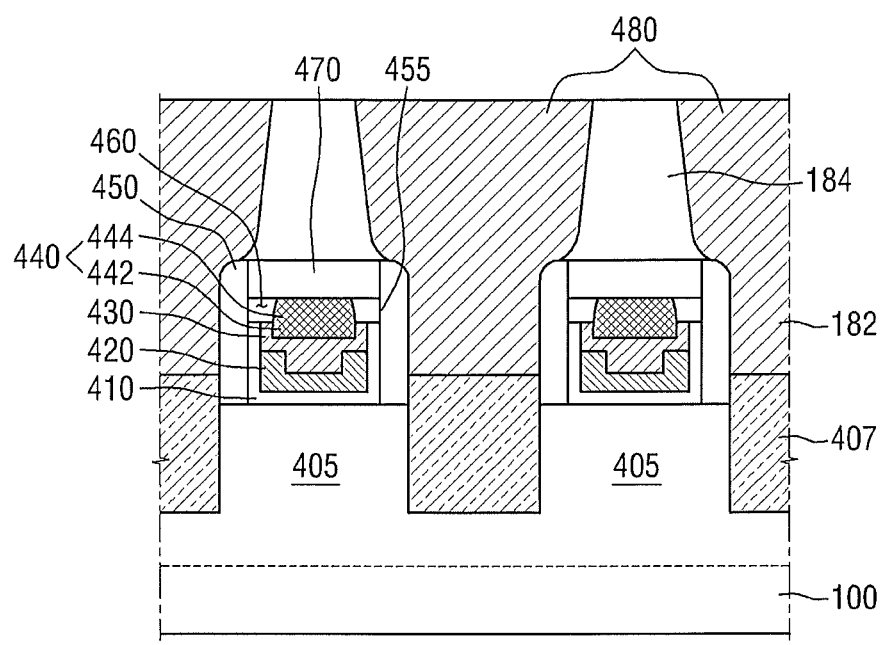
FIG. 20 is a cross-sectional view of the semiconductor device in FIG. 19 taken along line B-B.

FIG. 19 is a perspective view illustrating a semiconductor device according to some embodiments of the present inventive concept. FIG. 20 is a cross-sectional view of the semiconductor device in FIG. 19 taken along line B-B. Referring to FIGS. 19 and 20, the fourth gate insulation film 410 may be formed on the bottom surface of the fourth trench 455 and only on a portion of the sidewall of the fourth trench 455.

The fourth air-gap spacer 460 may be formed between the fourth upper gate electrode 440 and the fourth gate spacer 450 and may contact a sidewall of the top portion 444 of the fourth upper gate electrode 440 and at least a portion of the fourth gate spacer 450. The fourth air-gap spacer 460 may contact uppermost surfaces of the fourth lower gate electrode 430 and the fourth gate insulation film 410.

While FIGS. 19 and 20 illustrates that the uppermost surface of the fourth lower gate electrode 430 is coplanar with the uppermost surface of the fourth gate insulation film 410, in some embodiments the uppermost surface of the fourth gate insulation film 410 may be higher or lower than the uppermost surface of the fourth lower gate electrode 430 relative to the upper surface of the substrate 100.

Figure 21:
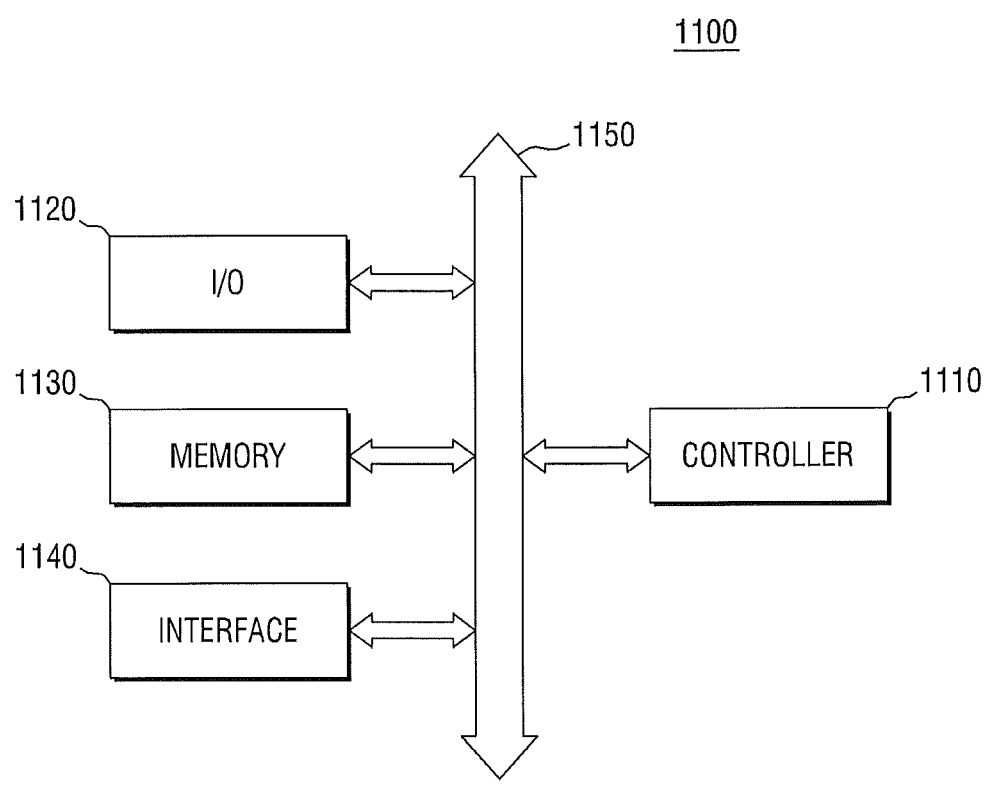
FIG. 21 is a block diagram of an electronic system including a semiconductor device according to some embodiments of the present inventive concept.

FIG. 21 is a block diagram of an electronic system including a semiconductor device according to some embodiments of the present inventive concept. Referring to FIG. 21, the electronic system 1100 including a semiconductor device according to some embodiments may include a controller 1110, an input/output (I/O) device 1120, a memory device 1130, an interface 1140, and a bus 1150. The controller 1110, the I/O device 1120, the memory device 1130, and/or the interface 1140 may be coupled to each other through the bus 1150. The bus 1150 corresponds to a path through which data transfer.

The controller 1110 may include at least one of a microprocessor, a digital signal processor, a microcontroller, or logic elements capable of performing similar functions to those of the above elements. The I/O device 1120 may include a keypad, a keyboard, and a display device. The memory device 1130 may store data and/or commands. The interface 1140 may transmit data to a communication network or receive data from the communication network. The interface 1140 may be in a wired or wireless form. For example, the interface 1140 may be an antenna or a wired/wireless transceiver. The electronic system 1100 may further include a high-speed dynamic random access memory (DRAM) and/or a high-speed SRAM as an operation memory for improving the operation of the controller 1110.

The electronic system 1100 can be applied to a personal digital assistant (PDA), a portable computer, a web tablet, a wireless phone, a mobile phone, a digital music player, a memory card, and all electronic products that can transmit and/or receive information in a wireless environment.

Figure 22:
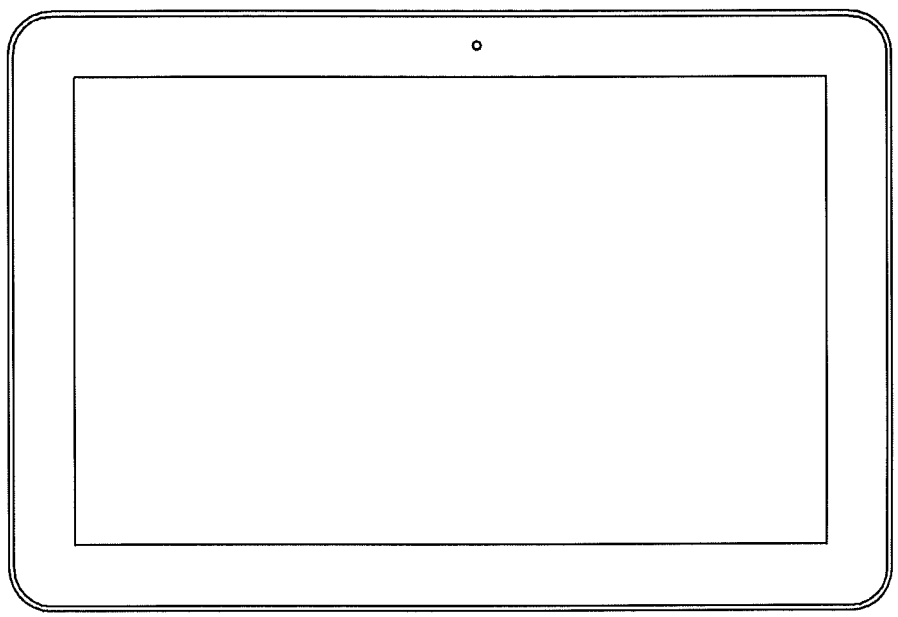
FIGS. 22 and 23 are example systems including a semiconductor device according to some embodiments of the present inventive concept.
Figure 23:
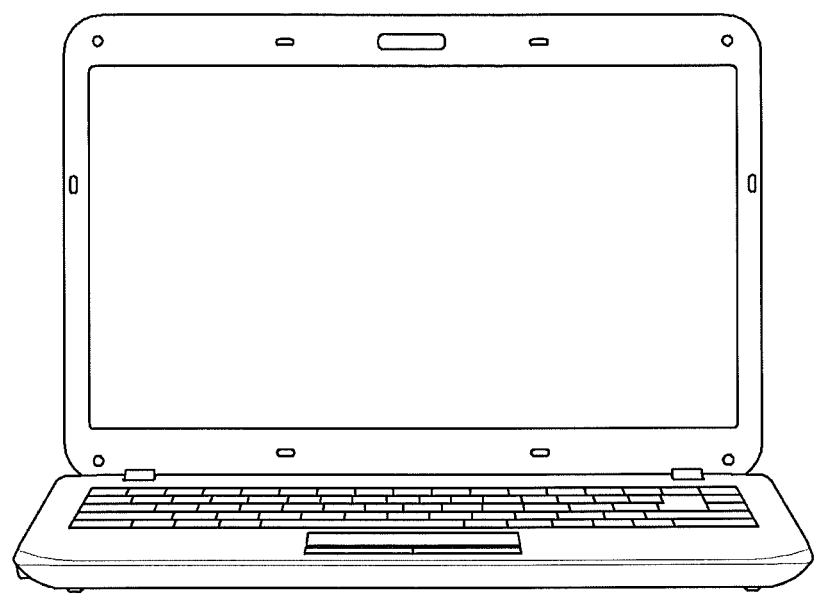

FIGS. 22 and 23 are example systems including a semiconductor device according to some embodiments of the present inventive concept. FIG. 22 shows a tablet PC, and FIG. 23 shows a notebook computer. A semiconductor device according to some embodiments of the present inventive concept can be used in a table PC, a notebook computer, and the like.

Figure 24:
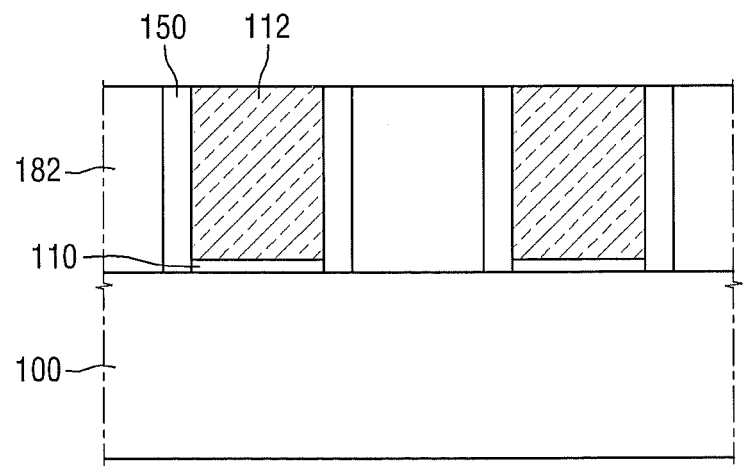
FIGS. 24 through 30 cross-sectional views illustrating intermediate structures provided methods of fabricating a semiconductor device according to some embodiments of the present inventive concept.

FIGS. 24 through 30 cross-sectional views illustrating intermediate structures provided methods of fabricating a semiconductor device according to some embodiments of the present inventive concept. Referring to FIG. 24, the first gate insulation film 110 and a dummy gate 112 may be formed on the substrate 100. The first gate insulation film 110 and the dummy gate 112 are sequentially stacked on the substrate 100.

The first gate insulation film 110 may include a high-k material. The dummy gate 112 may include, for example, silicon, specifically polycrystalline silicon (poly Si), amorphous silicon (a-Si) and a combination thereof. The dummy gate 112 may be undoped or doped with impurity. The first gate spacer 150 may be formed on a sidewall of a stacked structure including the first gate insulation film 110 and the dummy gate 112. After the first gate spacer 150 is formed, source/drain regions may be formed adjacent both sides of the dummy gate 112.

A first interlayer dielectric film 182 covering the dummy gate 112 and the first gate spacer 150 may be formed on the substrate 100. The first interlayer dielectric film 182 may include, for example, at least one of a low-k material, oxide, nitride, and oxynitride. The first interlayer dielectric film 182 may be removed until uppermost surfaces of the first gate spacer 150 and the dummy gate 112 are exposed. An upper surface of the first interlayer dielectric film 182 may be planarized. The first interlayer dielectric film 182 may be removed using, for example, a chemical mechanical polishing (CMP) process.

Figure 25:
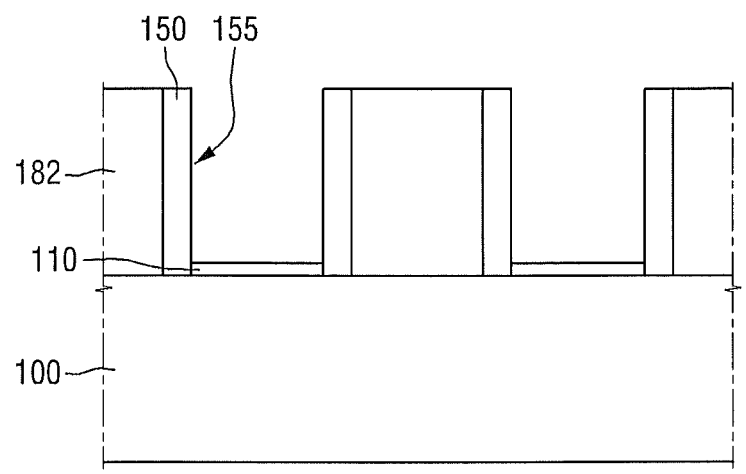

Referring to FIG. 25, the dummy gate 112 may be removed to form a first trench 155 defined by a pair of the first gate spacers 150 on the substrate 100. The first trench 155 exposes an upper surface of the first gate insulation film 110. The dummy gate 112 may be removed using a wet etching process or a dry etching process. During a wet etching process, the dummy gate 112 may be removed by exposing the dummy gate 112 to an aqueous solution including a hydroxide source at a sufficiently high temperature for a sufficiently long time. The hydroxide source may be, for example, ammonium hydroxide or tetraalkyl ammonium, for example, tetramethyl ammonium hydroxide (TMAH).

Figure 26:
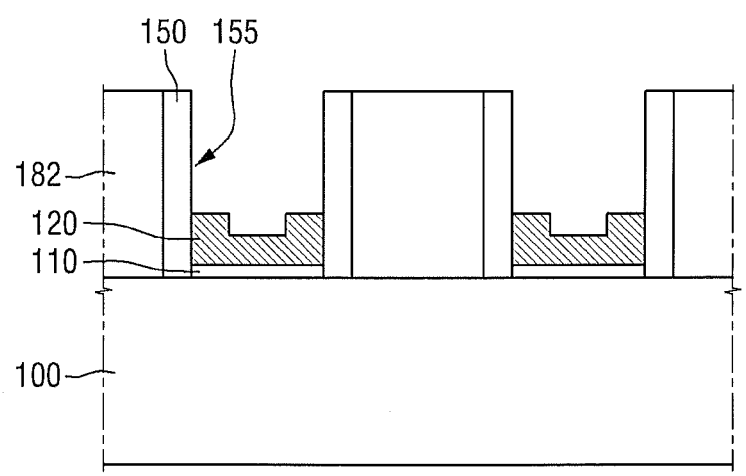

Referring to FIG. 26, the first work function control film 120 may be formed in the first trench 155. The first work function control film 120 may be formed on the first gate insulation film 110. The first work function control film 120 may be formed on a bottom surface of the first trench 155 and may cover a portion of the sidewall of the first trench 155. The first work function control film 120 may be formed, for example, using following processes. A preliminary work function control film may be formed conformally on the sidewall and the bottom surface of the first trench 155 and an upper surface of the first interlayer dielectric film 182. Then the preliminary work function control film formed on the sidewall of the first trench 155 may be removed. In some embodiments, an upper surface of the first work function control film 120 may include a recess as illustrated in FIG. 26.

Figure 27:
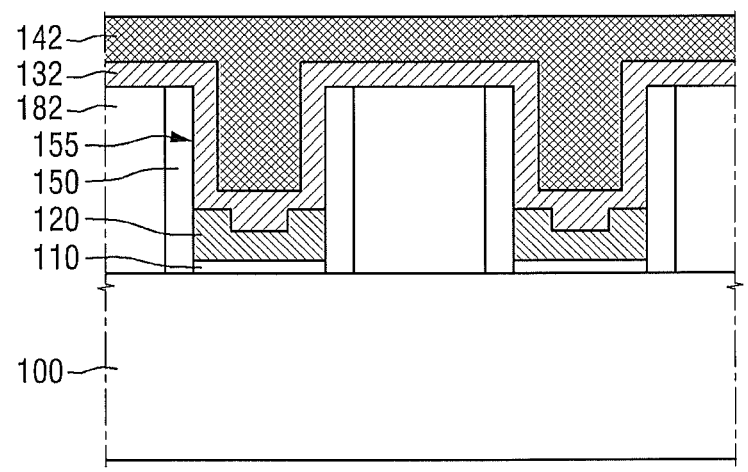

Referring to FIG. 27, a lower gate electrode film 132 may be formed on the upper surface of the first interlayer dielectric film 182 and conformally on the sidewall of the first gate spacers 150 and the first work function control film 120. The lower gate electrode film 132 may include, for example, TiN.

An upper gate electrode film 142 filling a remaining portion of the first trench 155 and covering the first interlayer dielectric film 182 may be formed on the lower gate electrode film 132. The upper gate electrode film 142 may cover an entire upper surface of the lower gate electrode film 132. The upper gate electrode film 142 may include a material having an etching selectivity with respect to the lower gate electrode film 132 and may include, for example, tungsten (W). However, the present inventive concept is not limited thereto.

Figure 28:
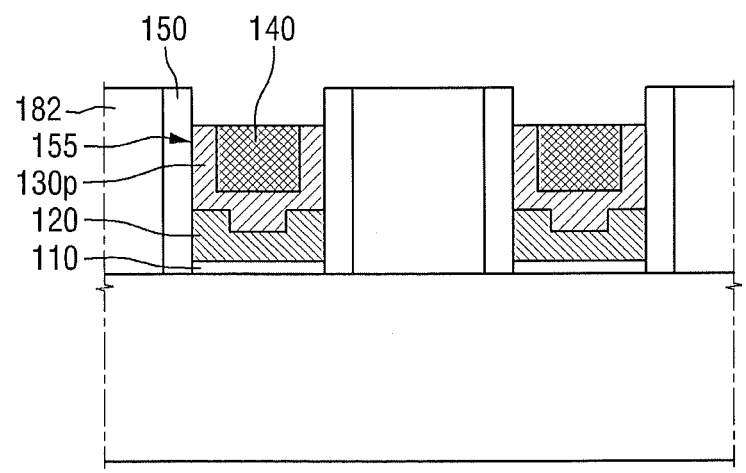

Referring to FIG. 28, the upper gate electrode film 142 and the lower gate electrode film 132 are recessed and a preliminary lower gate electrode 130p and a first upper gate electrode 140 may be formed in the first trench 155. The first upper gate electrode 140 and the preliminary lower gate electrode 130p may be concurrently formed by a process, for example, an etch-back process.

An uppermost surface of the first upper gate electrode 140 may be lower than an uppermost surface of the first gate spacer 150 relative to the upper surface of the substrate 100. That is, the first upper gate electrode 140 may be recessed into the first trench 155. In addition, an uppermost surface of the preliminary lower gate electrode 130p may be also lower than the uppermost surface of the first gate spacer 150 relative to the upper surface of the substrate 100. In some embodiments, the uppermost surface of the preliminary lower gate electrode 130p may be coplanar with the uppermost surface of the first upper gate electrode 140.

The preliminary lower gate electrode 130p may be formed conformally on the portion of the sidewall of the first trench 155 and the first work function control film 120. In some embodiments, the preliminary lower gate electrode 130p may have a substantially constant thickness. The first upper gate electrode 140 may be on the preliminary lower gate electrode 130p, and both sidewalls and bottom surface of the first upper gate electrode 140 may be covered by the preliminary lower gate electrode 130p.

Figure 29:
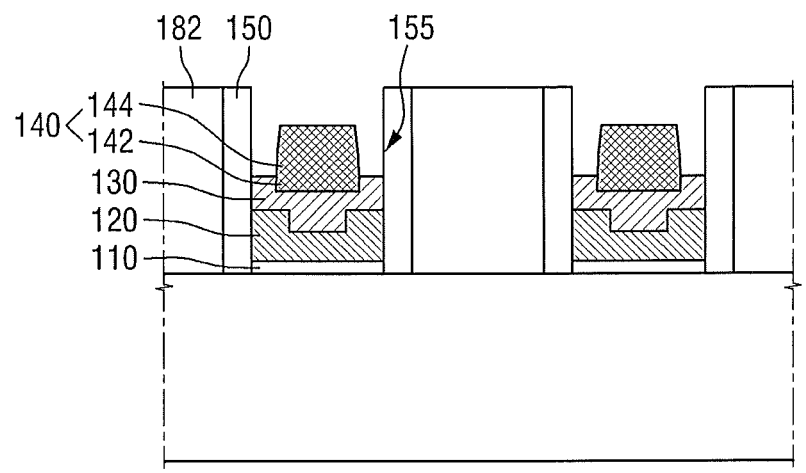

Referring to FIG. 29, the preliminary lower gate electrode 130p covering the sidewall of the first upper gate electrode 140 may be partially removed and thus the first lower gate electrode 130 and a space between the sidewall of the first upper gate electrode 140 and the inner sidewall of the first gate spacer 150 may be concurrently formed. The first upper gate electrode 140 may include the bottom portion 142 and the top portion 144. The first lower gate electrode 130 may expose the top portion 144 of the first upper gate electrode 140 and cover the sidewall of the bottom portion 142 of the first upper gate electrode 140.

The first lower gate electrode 130 may be formed using a dry etching process or a wet etching process. A portion of the preliminary lower gate electrode 130p overlapping a sidewall of the top portion 144 of the first upper gate electrode may be removed using an etching gas or liquid etchant that may selectively etch the preliminary lower gate electrode 130p with respect to the first upper gate electrode 140. For example, the first lower gate electrode 130 may include TiN and the first upper gate electrode 140 may include tungsten (W). The preliminary lower gate electrode 130p overlapping the top portion 144 of the first upper gate electrode 140 may be removed using a chlorine-based etching gas.

Figure 30:
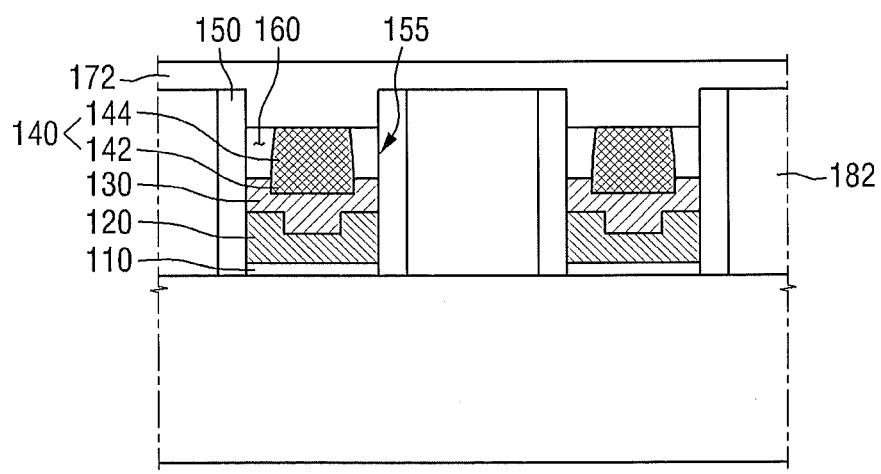

Referring to FIG. 30, a capping layer 172 filling the upper portion of the first trench 155 may be formed on the first upper gate electrode 140 and the first lower gate electrode 130. The capping layer 172 may seal a top portion of the space between the sidewall of the first upper gate electrode 140 and the inner sidewall of the first gate spacer 150, such that the first air-gap spacer 160 may be formed under the capping layer 172. The capping layer 172 may be formed on the upper surface of the first interlayer dielectric film 182.

The first air-gap spacer 160 may overlap the top portion 144 of the first upper gate electrode 140 and may contact both the first gate spacer 150 and the top portion 144 of the first upper gate electrode 140.

Referring to FIG. 2 again, the capping layer 172 formed on the upper surface of the first interlayer dielectric film 182 may be removed until the upper surface of the first interlayer dielectric film 182 is exposed, and thus the first capping pattern 170 filling the upper portion of the first trench 155 may be formed.

Referring to FIG. 3 again, the second interlayer dielectric film 184 may be formed on the first interlayer dielectric film 182. The second interlayer dielectric film 184 may cover the first capping pattern 170 and the first gate spacer 150. The first contact 180 passing through the second interlayer dielectric film 184 and the first interlayer dielectric film 182 may be formed. The first contact 180 may be formed adjacent the first gate spacer 150. The first contact 180 may be formed using, for example, a self aligned contact (SAC) process. The first contact 180 may be electrically connected to the source/drain formed on the substrate 100.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. An integrated circuit device, comprising:
a pair of spacers spaced apart from, each other on a substrate, wherein the pair of spacers define a recess;
a lower conductive pattern in the recess on the substrate;
an upper conductive pattern in the recess on the lower conductive pattern, wherein the upper conductive pattern exposes a portion of an upper surface of the lower conductive pattern adjacent a sidewall of the upper conductive pattern, an inner sidewall of one of the pair of spacers, the portion of the upper surface of the lower conductive pattern and the sidewall of the upper conductive pattern define a space, and the upper conductive pattern has an etch selectivity with respect to the lower conductive pattern; and
a capping pattern on the upper conductive pattern, wherein the capping pattern seals a top portion of the space such that a cavity is disposed under the capping pattern,
wherein the lower and upper conductive patterns comprise a gate electrode.

2. The integrated circuit device of claim 1, wherein an uppermost surface of the upper conductive pattern is lower than uppermost surfaces of the pair of spacers relative to an upper surface of the substrate.

3. The integrated circuit device of claim 2, wherein the capping pattern is in the recess.

4. The integrated circuit device of claim 1, wherein the cavity comprises an air-gap.

5. The integrated circuit device of claim 1, further comprising an insulating pattern in the cavity.

6. The integrated circuit device of claim 5, wherein the insulating pattern comprises SiCN, SiBCN or SiOCN.

7. The integrated circuit device of claim 1, further comprising
a gate insulator between the substrate and the gate electrode, wherein the gate insulator extends between the inner sidewall of the one of the pair of spacers and a sidewall of the gate electrode.

8. The integrated circuit device of claim 7, wherein an uppermost surface of the lower conductive pattern and an uppermost surface of the gate insulator are at an equal level.

9. The integrated circuit device of claim 7, farther comprising a work function control pattern between the substrate and the lower conductive pattern.

10. The integrated circuit device of claim 9, wherein an upper surface of the work function control pattern comprises a recess.

11. The integrated circuit device of claim 9, wherein the lower conductive pattern covers an entire upper surface of the work function control pattern.

12. The integrated circuit device of claim 9, wherein the work function control pattern conformally extends on a portion of a sidewall and a bottom surface of the upper conductive pattern, and the lower conductive pattern conformally extends between the upper conductive pattern and the work function control pattern.

13. The integrated circuit device of claim 1, wherein the lower conductive pattern partially surrounds the sidewall of the upper conductive pattern.

14. The integrated circuit device of claim 1, further comprising:
a conductive region on the substrate adjacent the one of the pair of spacers and out of the recess;
an insulating layer on the capping pattern, the pair of spacers and the conductive region; and
a conductive pattern passing through the insulating layer, wherein the conductive pattern contacts the one of the pair of spacers and the conductive region.

15. The integrated circuit device of claim 14, wherein the insulating layer has an etch selectivity with respect to the pair of spacers.

16. The integrated circuit device of claim 14, wherein the conductive pattern contacts an upper surface of the capping pattern, and the insulating layer has an etch selectivity with respect to the capping pattern.

17. The integrated circuit device of claim 1, wherein;
the pair of spacers comprise a first pair of spacers, the recess comprises a first recess, the lower and upper conductive patterns comprise a first gate electrode, and the capping pattern comprises a first capping pattern;
the first pair of spacers, the first gate electrode, and the first capping pattern comprise a first gate structure in a first region of the substrate; and
the device further comprises a second gate structure in a second region of the substrate, wherein the second gate structure is free of a cavity and comprises:
a second pair of spacers spaced apart from each other on the substrate, wherein the second pair of spacers defines a second recess;
a second gate electrode in the second recess on the substrate, wherein the second gate electrode comprises a material included in the lower conductive pattern of the first gate electrode; and
a second capping pattern on the second gate electrode.

18. The integrated circuit device of claim 17, wherein art upper surface of the second gate electrode is planar and the second capping pattern contacts the upper surface of the second gate electrode.

19. The integrated circuit device of claim 17, wherein:
the material included in the lower conductive pattern comprises a first material and the upper conductive pattern of the first gate electrode comprises a second material; and
the second material is absent from the second gate electrode pattern.

20. An integrated circuit device, comprising:
a pair of spacers spaced apart from each other on a substrate, wherein the pair of spacers define a recess;
a conductive pattern in the recess on the substrate, wherein the conductive pattern comprises an upper portion and a lower portion, and a width of the upper portion is smaller than a width of the lower portion such that a space is defined by a sidewall of the upper portion of the conductive pattern and an inner sidewall of one of the pair of spacers, and wherein the conductive pattern comprises a gate electrode; and
a capping pattern in the recess on the conductive pattern, wherein the capping pattern seals a top portion of the space such that a cavity is disposed under the capping pattern.

21. The integrated circuit device of claim 20, wherein the upper portion of the conductive pattern has an etching selectivity with respect to the lower portion of the conductive pattern.

22. The integrated circuit device of claim 20, wherein an uppermost surface of the conductive pattern is lower than uppermost surfaces of the pair of spacers relative to an upper surface of the substrate.

23. An integrated circuit device, comprising:
a conductive pattern on a substrate, wherein the conductive pattern comprises an upper conductive pattern and a lower conductive pattern, wherein the lower conductive pattern has an etch selectivity with respect to the upper conductive pattern and extends between the upper conductive pattern and the substrate, and wherein the conductive pattern comprises a gate electrode;

a spacer on the substrate adjacent a sidewall of the conductive pattern;

a cavity between a sidewall of the upper conductive pattern and an inner sidewall of the spacer; and a capping pattern on the conductive pattern and on the spacer.

24. The integrated circuit device of claim 23, wherein the capping pattern contacts the inner sidewall of the spacer.

25. The integrated circuit device of claim 23, wherein an uppermost surface of the upper conductive pattern is higher than an uppermost surface of the lower conductive pattern relative to an upper surface of the substrate.

26. The integrated circuit device of claim 25, wherein the upper conductive pattern exposes a portion of the uppermost surface of the lower conductive pattern adjacent the inner sidewall of the spacer.

27. An integrated circuit device, comprising:

a pair of spacers spaced apart from each other on a substrate, wherein the pair of spacers define a recess;

a conductive pattern in the recess on the substrate, wherein an uppermost surface of the conductive pattern is lower than uppermost surfaces of the pair of spacers relative to an upper surface of the substrate, and the conductive pattern comprises a gate electrode;

a cavity between the conductive pattern and an inner sidewall of one of the pair of spacers, wherein the cavity only covers an upper portion of conductive pattern and on the one of the pair of spacers;

a capping pattern in the recess on the conductive pattern;

an insulating layer on the capping pattern and the pair of spacers, wherein the insulating layer has an etch selectivity with respect to the pair of spacers; and a through conductive pattern passing through the insulating layer, wherein the through conductive pattern contacts an outer sidewall of the one of the pair of spacers.

28. The integrated circuit device of claim 27, wherein a horizontal distance between the inner sidewall of the one of the pair of spacers and the upper portion of the conductive pattern is greater than a horizontal distance between the inner sidewall of the one of the pair of spacers and a lower portion of the conductive pattern.

29. The integrated circuit device of claim 28, wherein the upper portion of the conductive pattern has an etch selectivity with respect to the lower portion of the conductive pattern.

30. The integrated circuit device of claim 27, further comprising:

a conductive region on the substrate adjacent the one of the pair of spacers and out of the recess, wherein the through conductive pattern contacts the conductive region.

* * * * *